United States Patent
Hoshizaki

(10) Patent No.: US 9,893,068 B2
(45) Date of Patent: Feb. 13, 2018

(54) METHOD FOR MANUFACTURING A SEMICONDUCTOR DEVICE

(71) Applicant: RENESAS ELECTRONICS CORPORATION, Tokyo (JP)

(72) Inventor: Hiroyuki Hoshizaki, Hitachinaka (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/623,076

(22) Filed: Jun. 14, 2017

(65) Prior Publication Data

US 2017/0287916 A1 Oct. 5, 2017

Related U.S. Application Data

(63) Continuation of application No. 14/694,338, filed on Apr. 23, 2015, now Pat. No. 9,711,509.

(30) Foreign Application Priority Data

Apr. 25, 2014 (JP) ................................. 2014-091299

(51) Int. Cl.
  *H01L 27/108* (2006.01)
  *H01L 49/02* (2006.01)

(52) U.S. Cl.
  CPC .. *H01L 27/10808* (2013.01); *H01L 27/10852* (2013.01); *H01L 28/90* (2013.01)

(58) Field of Classification Search
  CPC ......... H01L 27/10808; H01L 27/10811; H01L 27/10814; H01L 27/10852; H01L 28/40
  See application file for complete search history.

(56) References Cited

U.S. PATENT DOCUMENTS 6,383,866 B1 * 5/2002 Mizukoshi ........ H01L 27/10852
  257/E21.013
6,436,762 B1 * 8/2002 Tzeng ............... H01L 27/10888
  257/E21.019

(Continued)

FOREIGN PATENT DOCUMENTS

JP 2003-229497 A 8/2003
JP 2007-134654 A 5/2007

OTHER PUBLICATIONS

Non-Final Office Action dated Feb. 26, 2016, issued in U.S. Appl. No. 14/694,338.

(Continued)

*Primary Examiner* — Earl Taylor
(74) *Attorney, Agent, or Firm* — McDermott Will & Emery LLP

(57) ABSTRACT

To effectively prevent short circuit between capacitors adjacent to each other. A semiconductor device has a substrate, an interlayer insulating film, a plurality of capacitors, and an isolation insulating film. The interlayer insulating film is located over the substrate. The capacitors are located in a plurality of recesses, respectively. The recesses each have an opening in the surface of the interlayer insulating film. The isolation insulating film lies in the interlayer insulating film. The isolation insulating films are located between recesses adjacent to each other in plan view. Further, the isolation insulating film is made of a material different from that of the interlayer insulating film.

4 Claims, 29 Drawing Sheets

B-B'

(56) References Cited

U.S. PATENT DOCUMENTS

| | | | | |
|---|---|---|---|---|
| 6,492,245 B1* | 12/2002 | Liu | H01L 21/764 | 257/E21.008 |
| 6,597,033 B1* | 7/2003 | Nakamura | H01L 21/02167 | 257/309 |
| 6,720,232 B1* | 4/2004 | Tu | H01L 27/10811 | 257/296 |
| 6,873,001 B1* | 3/2005 | Nagata | H01L 27/10811 | 257/296 |
| 7,547,628 B2* | 6/2009 | Ikeda | H01L 27/10852 | 257/E21.577 |
| 7,659,567 B2* | 2/2010 | Aoki | H01L 21/76838 | 257/306 |
| 7,821,086 B2* | 10/2010 | Kajiyama | G11C 11/16 | 257/421 |
| 7,851,303 B2* | 12/2010 | Mikasa | H01L 27/10855 | 257/304 |
| 8,053,360 B2* | 11/2011 | Yamazaki | H01L 21/76831 | 257/E21.584 |
| 8,492,815 B2* | 7/2013 | Katsuki | H01L 27/0207 | 257/300 |
| 8,912,586 B2* | 12/2014 | Kim | H01L 27/10814 | 257/296 |
| 2003/0006444 A1* | 1/2003 | Amo | H01L 27/105 | 257/296 |
| 2003/0040183 A1* | 2/2003 | Kujirai | H01L 21/28061 | 438/694 |
| 2003/0054607 A1* | 3/2003 | Tu | H01L 27/10888 | 438/253 |
| 2003/0162353 A1* | 8/2003 | Park | H01L 27/10855 | 438/253 |
| 2004/0008534 A1* | 1/2004 | Kurth | G11C 11/005 | 365/149 |
| 2004/0084709 A1* | 5/2004 | Kim | H01L 27/10811 | 257/306 |
| 2004/0089913 A1* | 5/2004 | Yano | G11C 5/063 | 257/508 |
| 2004/0232462 A1* | 11/2004 | Takeuchi | H01L 21/7687 | 257/296 |
| 2005/0024812 A1* | 2/2005 | Yokoi | H01L 27/0629 | 361/306.3 |
| 2005/0029619 A1* | 2/2005 | Forbes | H01L 21/26506 | 257/516 |
| 2005/0093147 A1* | 5/2005 | Tu | H01L 21/76802 | 257/734 |
| 2005/0156258 A1* | 7/2005 | Park | C30B 1/02 | 257/412 |
| 2005/0216244 A1* | 9/2005 | Nahas | G06F 17/5036 | 703/13 |
| 2006/0076600 A1* | 4/2006 | Nakabayashi | H01L 27/10894 | 257/298 |
| 2006/0086960 A1* | 4/2006 | Arai | H01L 27/10852 | 257/303 |
| 2006/0118842 A1* | 6/2006 | Iwata | B82Y 10/00 | 257/295 |
| 2006/0263974 A1* | 11/2006 | Busch | B82Y 10/00 | 438/239 |
| 2006/0273371 A1* | 12/2006 | Tohyama | H01L 27/0207 | 257/303 |
| 2007/0102746 A1* | 5/2007 | Won | H01L 21/76816 | 257/303 |
| 2007/0111434 A1* | 5/2007 | Ikeda | H01L 27/10852 | 438/253 |
| 2007/0164265 A1* | 7/2007 | Kajiyama | G11C 11/16 | 257/3 |
| 2007/0241380 A1* | 10/2007 | Hasunuma | H01L 27/0207 | 257/296 |
| 2008/0197392 A1* | 8/2008 | Sakoh | H01L 27/0207 | 257/296 |
| 2008/0308854 A1* | 12/2008 | Takaishi | H01L 27/10814 | 257/304 |
| 2009/0008744 A1* | 1/2009 | Nishi | H01L 27/10855 | 257/532 |
| 2009/0135639 A1* | 5/2009 | Hirose | G11C 7/08 | 365/72 |
| 2009/0140386 A1* | 6/2009 | Inoue | H01L 27/0629 | 257/532 |
| 2010/0127316 A1* | 5/2010 | Tu | H01L 27/0255 | 257/296 |
| 2010/0221889 A1* | 9/2010 | Youn | H01L 27/10811 | 438/396 |
| 2010/0237394 A1* | 9/2010 | Park | H01L 27/0207 | 257/296 |
| 2010/0283091 A1* | 11/2010 | Park | H01L 23/5222 | 257/296 |
| 2011/0121372 A1* | 5/2011 | Kang | H01L 27/10894 | 257/296 |
| 2011/0193136 A1* | 8/2011 | Moritoki | H01L 21/76895 | 257/211 |
| 2011/0291239 A1* | 12/2011 | Nishi | H01L 27/10855 | 257/532 |
| 2012/0091519 A1* | 4/2012 | Tu | H01L 23/5223 | 257/303 |
| 2013/0001744 A1* | 1/2013 | Kim | H01L 27/10814 | 257/532 |
| 2013/0334582 A1* | 12/2013 | Mizuguchi | H01L 27/10805 | 257/296 |
| 2014/0159194 A1* | 6/2014 | Song | H01L 29/0649 | 257/522 |
| 2014/0361403 A1* | 12/2014 | Cho | H01L 21/764 | 257/532 |
| 2015/0311274 A1* | 10/2015 | Hoshizaki | H01L 27/10808 | 257/532 |

OTHER PUBLICATIONS

Non-Final Office Action dated Aug. 11, 2016, issued in U.S. Appl. No. 14/694,338.

Final Office Action dated Nov. 18, 2016, issued in U.S. Appl. No. 14/694,338.

Notice of Allowance dated Mar. 15, 2017, issued in U.S. Appl. No. 14/694,338.

\* cited by examiner

B-B'

B-B'

B-B'

B-B'

B-B'

METHOD FOR MANUFACTURING A SEMICONDUCTOR DEVICE

CROSS-REFERENCE TO RELATED APPLICATIONS

This application is a Continuation of U.S. application Ser. No. 14/694,338 filed Apr. 23, 2015, which in turn claims priority to the disclosure of Japanese Patent Application No. 2014-091299 filed on Apr. 25, 2014 including the specification, drawings, and abstract; each is incorporated herein by reference in their entireties.

BACKGROUND

The present invention relates to a semiconductor device, for example, a technology applicable to DRAM (dynamic random access memory).

DRAM is comprised of a plurality of transistors and a plurality of capacitors. An increase in capacitance of each capacitor is necessary for providing a DRAM having improved performance. A capacitor having a greater surface area has a greater capacitance. There is, on the other hand, currently a demand for decreasing the area of a semiconductor chip. At present, as described, for example, in Patent Documents 1 and 2, a capacitor is sometimes formed in a recess having an opening in the surface of an interlayer insulating film. In such a capacitor, the lower electrode, the capacitor insulating film, and the upper electrode thereof have a shape along the bottom surface and side surface of the recess. This makes it possible to increase the surface area of the capacitor while suppressing an increase in the area of the semiconductor chip.

PATENT DOCUMENTS

[Patent Document 1] Japanese Unexamined Patent Application Publication No. 2003-229497
[Patent Document 2] Japanese Unexamined Patent Application Publication No. 2007-134654

SUMMARY

As described above, DRAM has sometimes a capacitor in a recess thereof. DRAM has a plurality of such recesses and these recesses each have therein a capacitor. There is currently a demand for reducing the area of a semiconductor chip. In this case, the distance between recesses adjacent to each other should be decreased. When this distance is decreased, on the other hand, an interlayer insulating film that separates two recesses from each other is likely to lose its shape. When the interlayer insulating film loses its shape, lower electrodes in recesses (capacitors) adjacent to each other are likely to be brought into contact with each other. Contact between the lower electrodes may lead to short circuit between the capacitors adjacent to each other. Another problem and novel features will be apparent from the description herein and accompanying drawings.

In one embodiment, there is provided a semiconductor device having a substrate, a first interlayer insulating film, a first capacitor, a second capacitor, and a first isolation insulating film. The first interlayer insulating film is located on the substrate. The first capacitor is located in a first recess having an opening portion in the surface of the first interlayer insulating film. The second capacitor is located in a second recess having an opening portion in the surface of the first interlayer insulating film. The second capacitor is contiguous to the first capacitor. The first isolation insulating film is located in the first interlayer insulating film. The first isolation insulating film is located between the first recess and the second recess in plan view. Further, the first isolation insulating film is made of a material different from that of the first interlayer insulating film.

In another example, a semiconductor device has a substrate, a transistor, an interlayer insulating film, a capacitor, and a bit line. The transistor is located in the substrate. The interlayer insulating film is located on the transistor. The capacitor is electrically coupled to either one of the source and the drain of the transistor. On the other hand, the bit line is electrically coupled to the other one of the source and the drain of the transistor. The capacitor is formed in a recess having an opening in the surface of the interlayer insulating film. The bit line is, on the other hand, located in a region overlapping with the recess, when viewed from a direction perpendicular to the thickness direction of the interlayer insulating film.

By the above-described embodiment, short circuit between capacitors adjacent to each other can be prevented effectively.

DETAILED DESCRIPTION

Figure 1A:
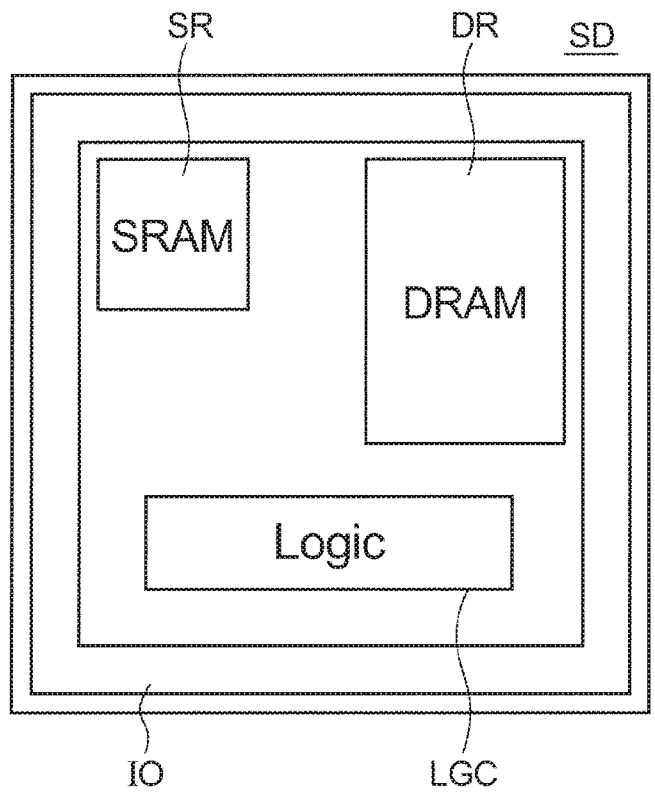
FIG. 1A is a plan view showing the configuration of a semiconductor device according to an embodiment and FIG. 1B is a plan view showing the layout of a DRAM region.

The embodiment will hereinafter be described referring to drawings. In all the drawings, like constituents will be identified by like reference numerals and descriptions on them will be omitted as needed.

FIG. 1A is a plan view showing the configuration of a semiconductor device SD of the present embodiment. The semiconductor device SD has a logic region LGC, a DRAM region DR, a SRAM SR, and an I/O region IO. The logic region LGC has a logic circuit. The DRAM region DR has a DRAM (dynamic random access memory). The SRAM region SR has a SRAM (static random access memory). The I/O region IO has an I/O (input/output) circuit. The input/output of signals and power supply in the semiconductor device SD are performed via the I/O circuit. The I/O region IO shown in FIG. 1A is placed along the edge of the semiconductor device SD and it surrounds the logic region LGC, the DRAM region DR, and the SRAM region. It is obvious that the layout of the semiconductor device SD is not limited to this layout. The semiconductor device SD does not necessarily have both the SRAM region SR and the logic region LGC.

Figure 1B:
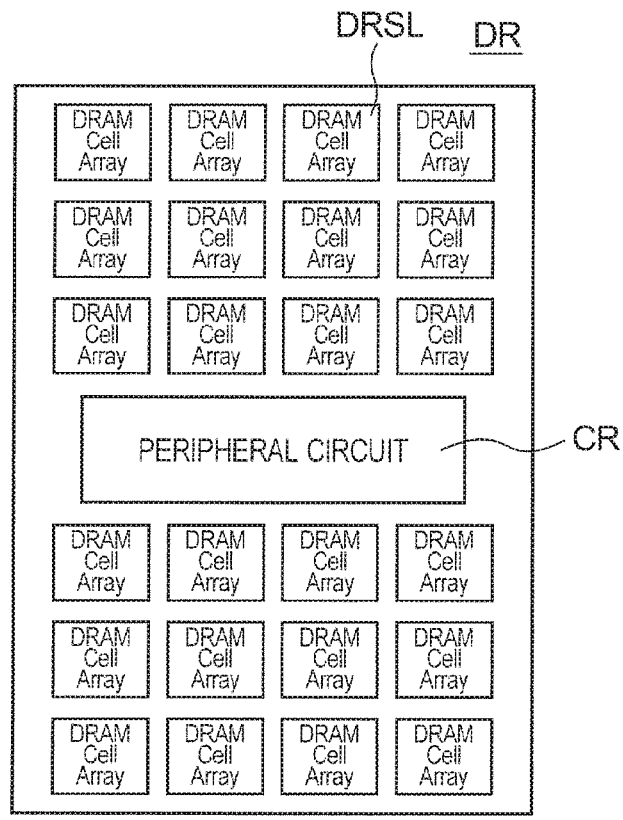

FIG. 1B is a plan view showing the layout of the DRAM region DR. The DRAM region DR has a plurality of memory cell arrays DRSL and a peripheral circuit CR. The memory cell arrays DRSL have, as will be described later in detail, a capacitor CP (not illustrated in this drawing) and a transistor TR (not illustrated in this drawing). The transistor TR serves as a transistor for writing and reading to/from the capacitor CP.

Figure 2:
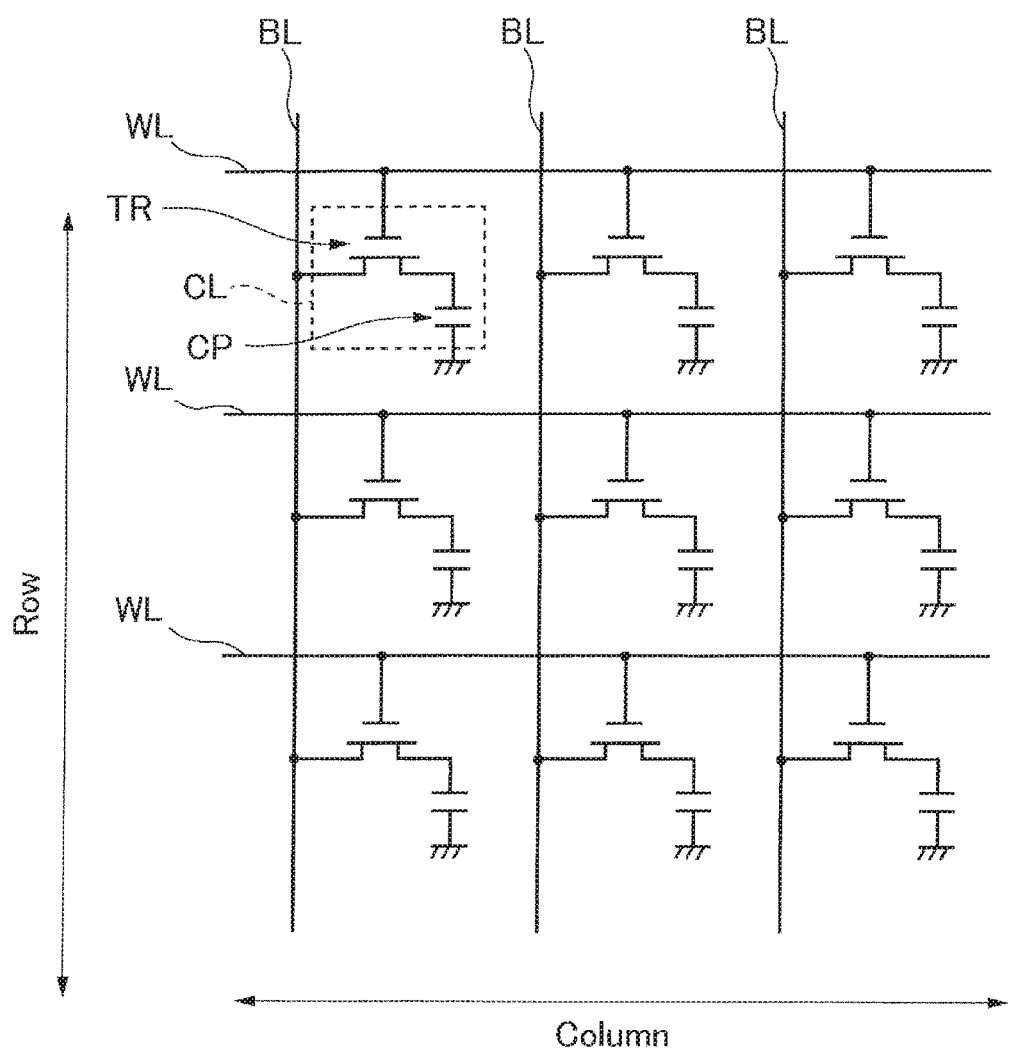
FIG. 2 is a circuit diagram showing the outline of the DRAM region of the semiconductor device of the embodiment.

FIG. 2 is a circuit diagram showing the outline of the DRAM region DR of the semiconductor device SE of the present embodiment. The semiconductor device SD includes a plurality of cells CL, a plurality of bit lines BL, and a plurality of word lines WL. The cells CL are each comprised of one transistor TR and one capacitor CP. The bit lines BL are arranged along a column. The word lines WL are arranged along a row.

The transistor TR of each of the cells CL includes a source, a drain, and a gate. Either one of the source and the drain is grounded via the capacitor CP. The other one of the source and the drain is coupled to the bit line. The gate is coupled to the word line WL. The cells CL are arranged in a two-dimensional matrix form along the bit lines BL and the word lines WL. In this case, combinations of the bit line BL and the word line WL to which the cell is coupled are different from each other. Read/write from/to a desired cell can be carried out by selecting a proper combination of the bit line BL and the word line WL.

Figure 3:
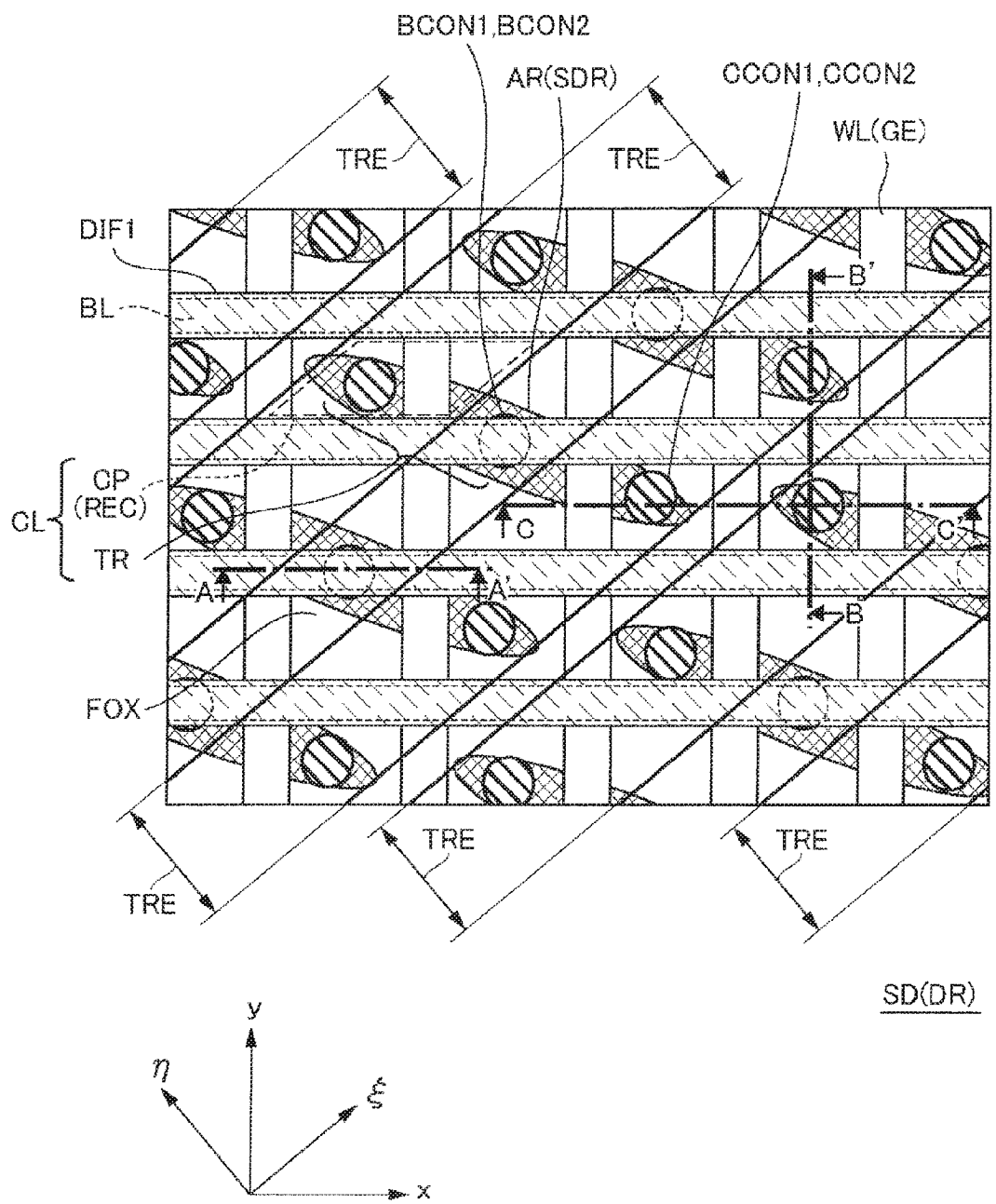
FIG. 3 is a plan view showing a portion of the DRAM region of the semiconductor device of the embodiment.
Figure 4:
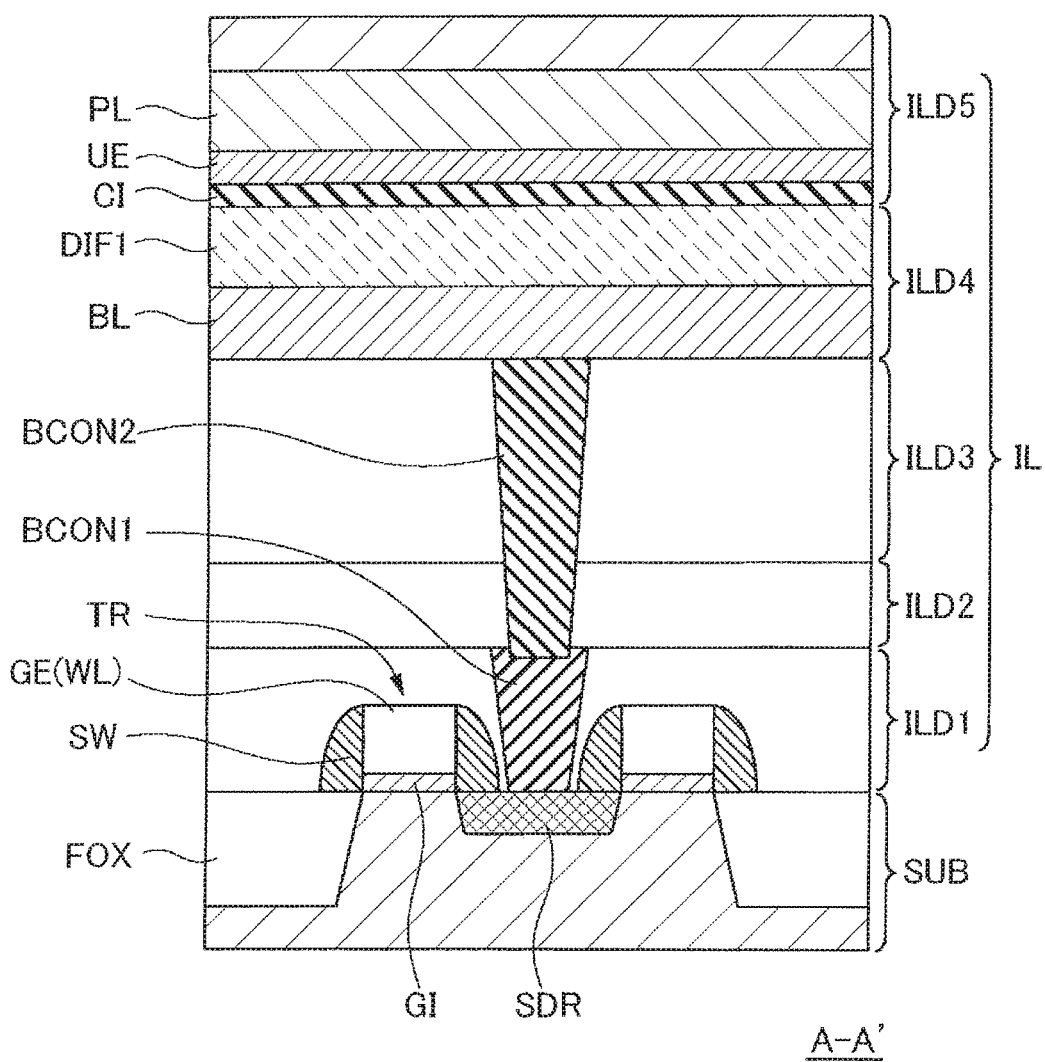
FIG. 4 is an A-A' cross-sectional view of FIG. 3.
Figure 5:
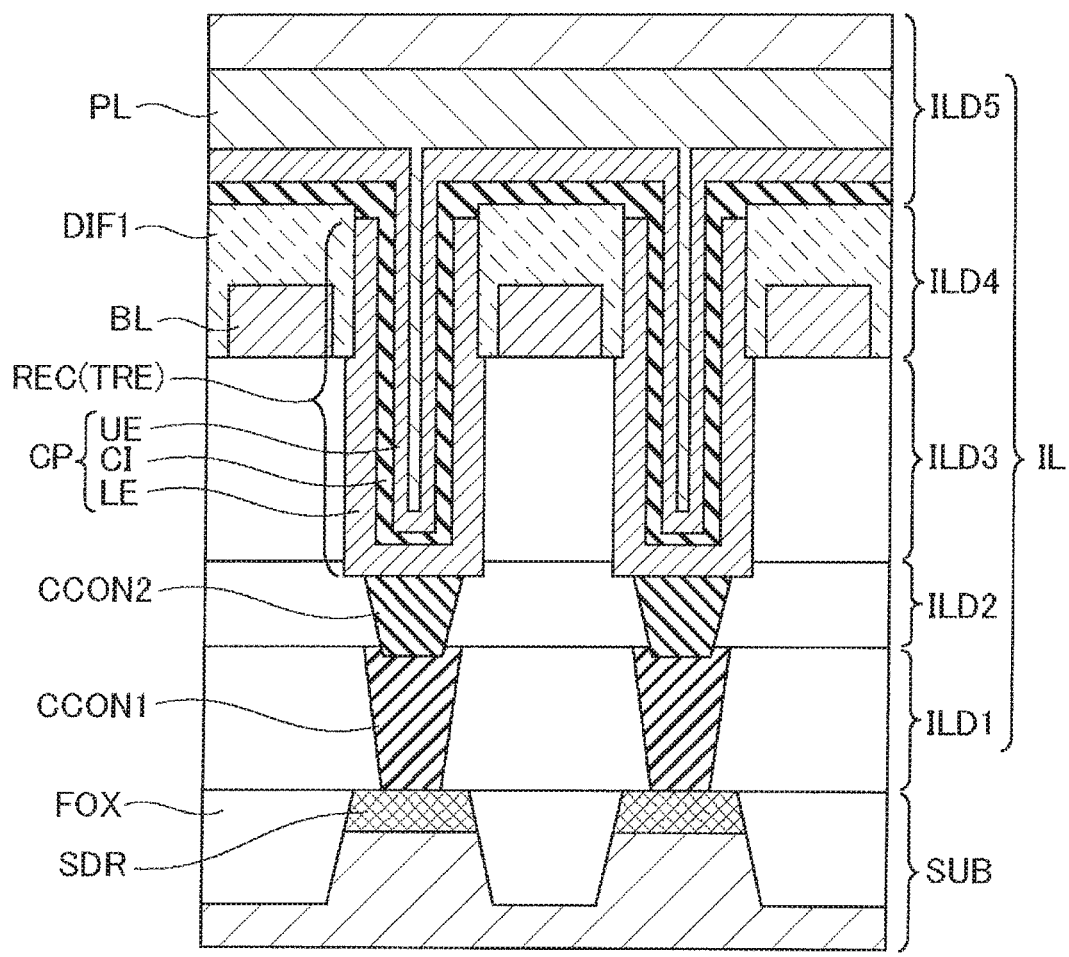
FIG. 5 is a B-B' cross-sectional view of FIG. 3.
Figure 6:
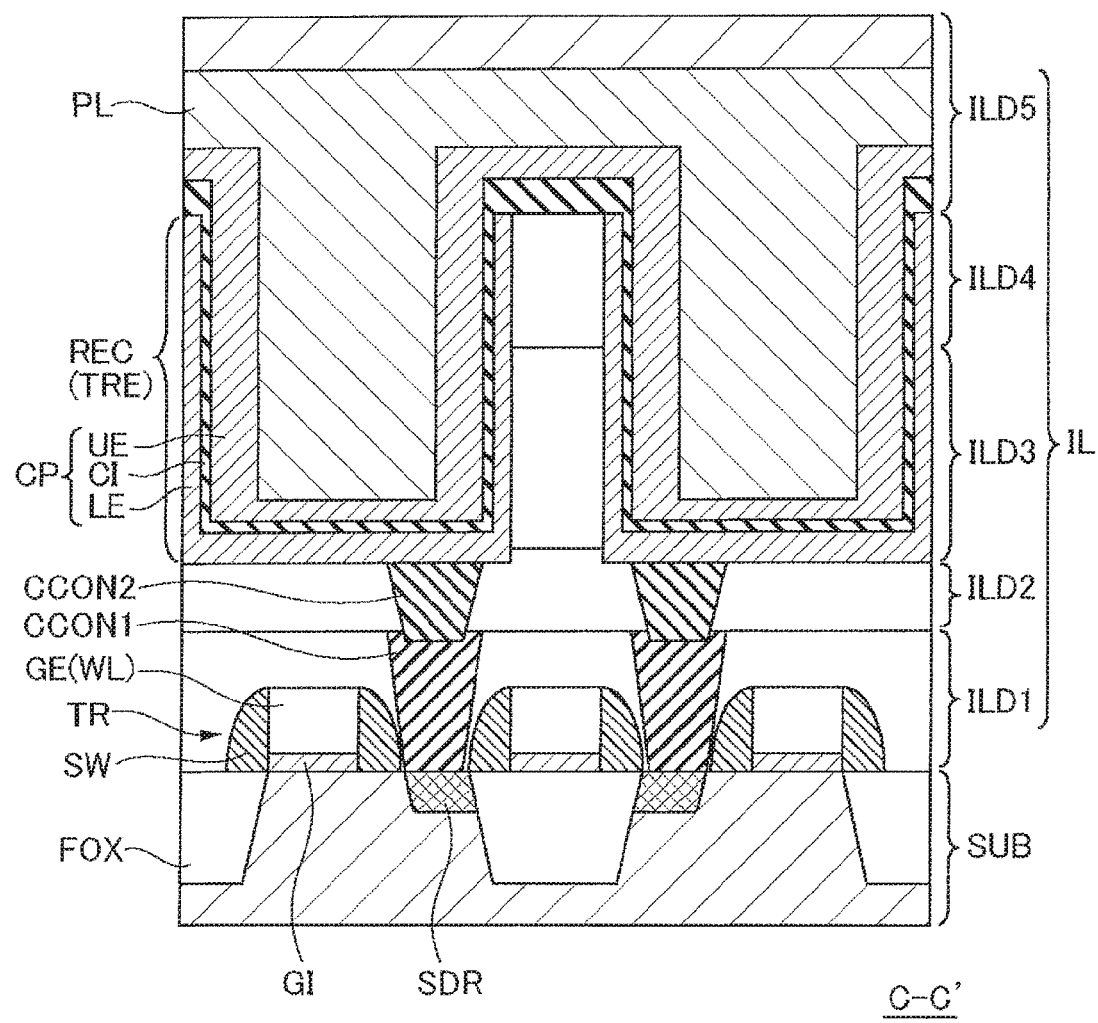
FIG. 6 is a C-C' cross-sectional view of FIG. 3.

FIG. 3 is a plan view showing a portion of the DRAM region DR of the semiconductor device SD of the present embodiment. FIG. 4 is an A-A' cross-sectional view of FIG. 3. FIG. 5 is a B-B' cross-sectional view of FIG. 3. FIG. 6 is a C-C' cross-sectional view of FIG. 3.

As shown in FIG. 3, the semiconductor device SD includes, similar to that shown in FIG. 2, a plurality of transistor TR, a plurality of capacitors CP, a plurality of bit lines BL, and a plurality of word lines WL. Further, the semiconductor device SD includes a substrate SUB and a wiring layer IL (FIGS. 4 to 6). The substrate SUB is a semiconductor substrate. More specifically, the substrate SUB is, for example, a silicon substrate or a SOI (silicon on insulator) substrate. The wiring layer IL lies over the substrate SUB. In the example shown in these drawings, the wiring layer IL includes interlayer insulating films ILD1, ILD2, ILD3, ILD4, and ILD5. The interlayer insulating films ILD1, ILD2, ILD3, ILD4, and ILD5 are arranged in order of mention from the side of the substrate SUB. The interlayer insulating films ILD1, ILD2, ILD3, ILD4, and ILD5 are made of, for example, a silicon oxide film ($SiO_2$) or a low-k material (such as a porous silica film).

The bit lines BL each extend in a first direction (in an x axis direction in FIG. 3). The bit lines BL are arranged along a second direction (in a y axis direction orthogonal to the x axis direction in FIG. 3). The word lines WL each extends in the second direction. The word lines WL are arranged along the first direction. The bit lines BL and the word lines WL thus configure a lattice in plan view. The bit lines BL are made of a conductive material (for example, a metal such as copper or aluminum). The word lines WL are also made of a conductive material (for example, polysilicon or metal). As will be described later in further detail, the bit lines BL and the word lines WL are located over the substrate SUB (FIGS. 4 to 6). The bit lines BL are located on the upper side of the word lines WL via some of the wiring layers IL.

The substrate SUB has, in the surface thereof, a plurality of active regions AR. Further, the substrate SUB has, in the surface layer thereof, a field oxide film FOX (interelement isolation layer). The field oxide film FOX is formed, for example, by STI (shallow trench isolation) or LOCOS (local oxidation of silicon). The field oxide film FOX surrounds each of the active regions AR in plan view. The active regions AR are therefore separated from each other by the field oxide film FOX.

The active regions AR each have an island-like planar shape having a longer side and a shorter side. In the example shown in the drawing, the active regions AR each have an elliptical planar shape. The respective planar shapes of the active regions AR are, at the longer side, directed in the same direction and they are tilted relative to the first direction (the x axis direction in FIG. 3) in plan view. The active regions AR are divided into three regions in plan view by two word lines WL adjacent to each other. In this case, the bit line BL overlaps with the center region of these three regions in plan view.

A region where the active region AR and the bit line BL overlap with each other in plan view has contacts BCON1 and BCON2. The contact BCON1 is a contact provided in a coupling hole that penetrates through the interlayer insulating film ILD1. The contact BCON2 is a contact provided in a coupling hole that penetrates through the interlayer insulating films ILD2 and ILD3. The active region AR is coupled to the bit line BL via the contacts BCON1 and BCON2.

Two end regions of the above-mentioned three regions each have therein contacts CCON1 and CCON2. The contact CCON1 is a contact provided in a coupling hole penetrating through the interlayer insulating film ILD1. The contact CCON2 is a contact provided in a coupling hole penetrating through the interlayer insulating film ILD2. The active region AR is coupled to the capacitor CP via the contacts CCON1 and CCON2.

The contacts BCON1, BCON2, CCON1, and CCON2 are each made of a conductive material (for example, a metal such as copper or tungsten). The contacts (contacts BCON1, BCON2, CCON1, and CCON2) may have, on the bottom surface and side surface thereof, a barrier metal film (for example, titanium nitride (TiN) or tantalum nitride (TaN)).

The active regions AR each have therein a transistor TR. The transistor TR has a gate electrode GE, a source/drain region SDR, a gate insulating film GI (FIGS. 4 and 6), and a sidewall SW (FIGS. 4 and 6).

More specifically, as shown in FIG. 3, a portion of the word line WL becomes the gate electrode GE. In this case, the word line WL functions as the gate electrode GE in a region overlapping with the active region AR in plan view. The transistor TR is therefore formed in a region in which the active region AR obliquely crosses with the word line WL in plan view. In other words, in the active region AR, two transistors TR are formed by two word lines WL adjacent to each other. The gate electrode GE (word line WL) may have, on the surface thereof, a silicide film (for example, Ni silicide, Pt silicide, Co silicide, or Ti silicide).

The source/drain region SDR lies in the surface of the active region AR. The source/drain region SDR of each of the active regions AR is divided into three regions by the word line WL in plan view. The source/drain region SDR at the center of these three regions is a source/drain region to be used commonly by the above-mentioned two transistors TR. This central source/drain region SDR is electrically coupled to the bit line BL via the contacts BCON1 and BCON2. The remaining two source/drain regions SDR are, on the other hand, source/drain regions to be used by the two transistors TR separately. These two source/drain regions are electrically coupled to the respective capacitors CP via the contacts CCON1 and CCON2.

The source/drain region SDR may have, on the surface thereof, a silicide film. In this case, the silicide film of the source/drain region SDR is made of, for example, the same material as that of the silicide film (for example, Ni silicide, Pt silicide, Co silicide, or Ti silicide) formed on the surface of the gate electrode GE.

In each of the active regions AR, the transistor TR is coupled to the capacitor and they configure one cell CL. As described above, the active regions AR each have two transistors TR. These two transistors TR are coupled to respective capacitors CP. Each of the active regions AR therefore configures two cells CL.

The substrate SUB has, in the surface thereof, a plurality of active regions AR regularly arranged in plan view. Described specifically, the contacts BCON1 and BCON2 of the active regions AR are located on intersections of a plurality of bit lines BL and a plurality of tilted straight lines which will be described later. The tilted straight lines are straight lines extending in a direction (third direction: ξ axis direction in FIG. 3) in which, in a lattice comprised of the bit lines BL and the word lines WL, regions surrounded by two bit lines BL adjacent to each other and two word lines WL adjacent to each other are in contact with each other at corners thereof and form a row. The tilted straight lines adjacent to each other are, at a portion thereof crossing with the bit line BL, adjacent to each other in the first direction (the x axis direction in FIG. 3) via four word lines WL. The longer side of the active region AR has a tilt opposite to the tilt of the tilted straight line relative to the first direction (the x axis direction in FIG. 3), in other words, if the former one has a positive tilt, the latter one has a negative tilt.

As shown in FIGS. 4 and 6, the gate insulating film GI is located between the substrate SUB and the word line WL (gate electrode GE). The gate insulating film GI is made of, for example, a silicon oxide film ($SiO_2$), a silicon oxynitride film (SiON film), or a high-k material (for example, a hafnium silicate film (HfSiO) or a nitrogen-added hafnium silicate film).

As shown in FIGS. 4 and 6, the sidewall SW lies on the side surface of the word line WL (gate electrode GE). The sidewall SW is made of, for example, a silicon oxide film ($SiO_2$) or a silicon nitride film (SiN).

As FIGS. 5 and 6 show, the bit lines BL are formed above the substrate SUB via some of the wiring layers IL. More specifically, the interlayer insulating films ILD1, ILD2, ILD3, and ILD4 are arranged in order of mention from the side of the substrate SUB. The bit line BL lies in the interlayer insulating film ILD4. In this case, the bit line BL is located on the surface of the interlayer insulating film ILD3.

The bit line BL is covered with an isolation insulating film DIF1 (first isolation insulating film). The isolation insulating film DIF1 is made of a material (for example, a silicon nitride film (SiN), a silicon oxynitride film (SiON), or a silicon carbonitride film (SiCN)) different from that of the interlayer insulating films ILD1, ILD2, ILD3, and ILD4. The isolation insulating film DIFI extends, similar to the bit line BL, in the first direction (the x axis direction in FIG. 3). A plurality of the isolation insulating films DIF1 is, similar to the bit lines BL, arranged in the second direction (the y axis direction in FIG. 3).

The upper surface and the side surface of the isolation insulating film DIF1 have shapes substantially following the upper surface and the side surface of the bit line BL, respectively. In the example shown in FIG. 5, the thickness of a portion of the isolation insulating film DIF1 covering the upper surface of the bit line BL is greater than the thickness of a portion of the isolation insulating film covering the side surface of the bit line BL.

In the example shown in FIG. 5, the upper surface of the isolation insulating film DIF1 and the surface of the interlayer insulating film ILD4 have the same surface height. In other words, the upper surface of the isolation insulating film DIF1 has no step difference with the surface of the interlayer insulating film ILD4 and it becomes flush with the surface of the interlayer insulating film ILD4. Further, in other words, the surface of the interlayer insulating film ILD4 is polished until exposure of the upper surface of the isolation insulating film DIF1.

As shown in FIGS. 5 and 6, the wiring layer IL includes a recess REC. More specifically, the recess REC has an opening in the surface of the interlayer insulating film ILD4 (first interlayer insulating film). The recess REC has therein a capacitor CP. In the example shown in these drawings, the recess REC penetrates through the interlayer insulating films ILD4 and ILD3. The recess reaches, at the bottom portion thereof, the contact CCON2 (contact formed in the interlayer insulating film ILD2). The number of the interlayer insulating films which the recess REC penetrates through is not limited to the number of the example shown in these drawings (the number is two, that is, the interlayer insulating films ILD3 and ILD4). For example, the recess REC may penetrate through three or more interlayer insulating films.

As shown in FIG. 3, the recess REC is a portion of the trench TRE. The trench TRE has, similar to the recess REC, an opening in the interlayer insulating film ILD4. The trench TRE extends in the form of a line that passes a plurality of the contacts CCON1 and CCON2 arranged along the third direction (ξ axis direction in FIG. 3) in plan view. A plurality of the trenches TRE is arranged along a fourth direction (a η axis direction orthogonal to the ξ axis direction in FIG. 3). In this case, the trench TRE intersects with the isolation insulating film DIF1. The trench TRE is separated at a portion where the isolation insulating film DIF1 has been formed. In such a way, the trench TRE becomes a recess REC between the isolation insulating films DIF1 adjacent to each other. In the example shown in this drawing, the trench TRE has an elongated planar shape so that the recess REC has a parallelogram planar shape.

As will be described later in detail, the recesses REC are each formed in self alignment while using the isolation insulating film DIF1 as a hard mask. In other words, the recesses REC adjacent to each other in the third direction (ξ axis direction in FIG. 3) can be separated by the isolation insulating film DIF1 without using lithography. In this case, in the recesses REC adjacent to each other in the third direction (ξ axis direction in FIG. 3), at least a portion of the side surfaces opposite to each other in the third direction (ξ axis direction in FIG. 3) is made of the isolation insulating film DIF1. The recesses REC can therefore be separated from each other effectively along the third direction (ξ axis direction in FIG. 3).

In the example shown in this drawing, there are regions (for example, FIG. 3) in which the recesses REC comprised of two different trenches TRE are adjacent to each other via the bit line BL (isolation insulating film DIF1) in plan view. According to the present embodiment, such recesses REC can also be separated effectively by using the isolation insulating film DIF1.

As shown in FIGS. 5 and 6, the capacitor CP includes a lower electrode LE, a capacitor insulating film CI, and an upper electrode UE. The capacitor CP is located in the recess REC. As described above, the recess REC has a parallelogram planar shape so that the capacitor CP also has a parallelogram planar shape.

The lower electrode LE is located along the bottom surface and the side surface of the recess REC. It is necessary to enable application of respectively different potentials to the lower electrodes LE of the capacitors CP in different recesses REC. The lower electrode LE is therefore located only in the recess REC. In other words, the lower electrode LE does not extend across different recesses REC.

The capacitor insulating film CI covers the lower electrode LE inside the recess REC and covers the isolation insulating film DIF1 outside the recess REC. More specifically, the capacitor insulating film CI is located inside the lower electrode LE in the recess REC and extends along the bottom surface and side surface of the recess REC. Further, the capacitor insulating film CI extends across capacitors CP adjacent to each other. In such a manner, a plurality of the capacitors CP has the capacitor insulating film CI in common.

The upper electrode UE covers the capacitor insulating film CI. More specifically, the upper electrode UE is located inside the capacitor insulating film CI in the recess REC and extends along the bottom surface and side surface of the recess REC. Further, the upper electrode UE extends across capacitors CP adjacent to each other.

The upper electrode UE has thereon a conductive film PL which extends across the capacitors CP adjacent to each other. In the example shown in these drawings, a portion of the conductive film PL is located inside the upper electrode UE in the recess REC and fills the recess REC. The conductive film PL is covered with the interlayer insulating film ILD5. The conductive film PL is coupled to a wiring (not illustrated) on the interlayer insulating film ILD5 via a contact (not illustrated). From this wiring, a specific potential (for example, ground potential) is applied to the conductive film PL. As a result, this potential can be applied to the upper electrode UE of each of the capacitors CP via the conductive film PL.

The lower electrode LE and the upper electrode UE are made of, for example, a refractory metal (for example, tantalum (Ta), titanium (Ti), tantalum nitride (TaN), or titanium nitride (TiN)). The capacitor insulating film CI is made of, for example, a high-k material (for example, zirconium dioxide ($ZrO_2$) or zirconium aluminate ($ZrAlO_x$)). The conductive film PL is made of a material containing, for example, tungsten (W), titanium nitride (TiN), copper (Cu), or aluminum (Al).

Next, a method of manufacturing the semiconductor device SD will be described. FIGS. 7 to 17 are views for describing a method of manufacturing the semiconductor device SD shown in FIGS. 3 to 6. A left-side portion and a center portion in these drawings correspond to the A-A' cross-sectional view and B-B' cross-sectional view of FIG. 3, respectively. These drawings also include, in the right-side portion thereof, a cross-sectional view of a logic region LCG for describing the method.

Figure 7:
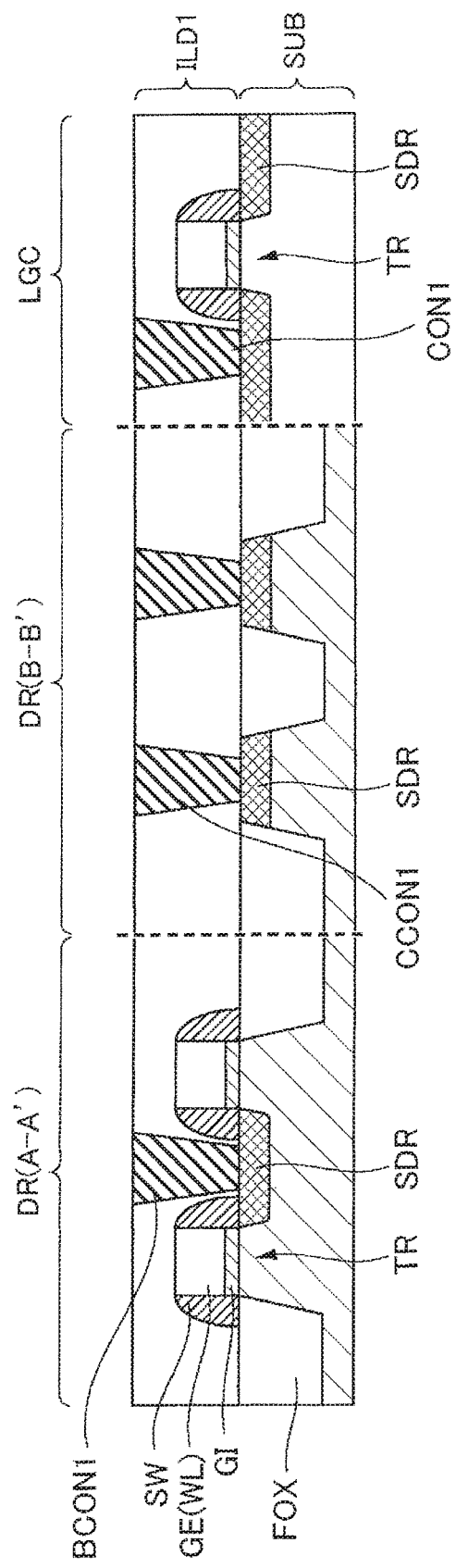
FIG. 7 is a view for describing a method of manufacturing the semiconductor device shown in FIGS. 3 to 6.

First, as shown in FIG. 7, a field oxide film FOX is formed in a substrate SUB. The field oxide film FOX is formed, for example, by STI or LOCOS. By this film, a plurality of active regions AR (FIG. 3) is defined in the surface of the substrate SUB.

Next, a gate insulating film GI and a gate electrode GE (word line WL) are formed on the substrate SUB by patterning. Next, an insulating film is formed on the substrate SUB. The gate electrode GE (word line WL) is covered with this insulating film. Then, this insulating film is etched back to form a sidewall SW.

Next, the surface of the substrate SUB is doped with an impurity to form a source/drain region SDR. Then, a silicide film (not illustrated) is formed on the surface of the gate electrode GE (word line WL) and the surface of the source/drain region SDR. As a result, formation of a transistor TR is completed.

Next, an interlayer insulating film ILD1 is formed on the substrate SUB. The transistor TR is covered with the interlayer insulating film ILD1. Coupling holes are then formed in the interlayer insulating film ILD1. In the DRAM region DR, contacts CCON1 and BCON1C are formed in these coupling holes. The contacts CCON1 and BCON1 are coupled to the source/drain region SDR of the DRAM region DR. In the logic region LGC, on the other hand, a contact CON1 is formed in the coupling hole of this region. The contact CON1 is coupled to the source/drain region SDR of the transistor TR in the logic region LGC.

Figure 8:
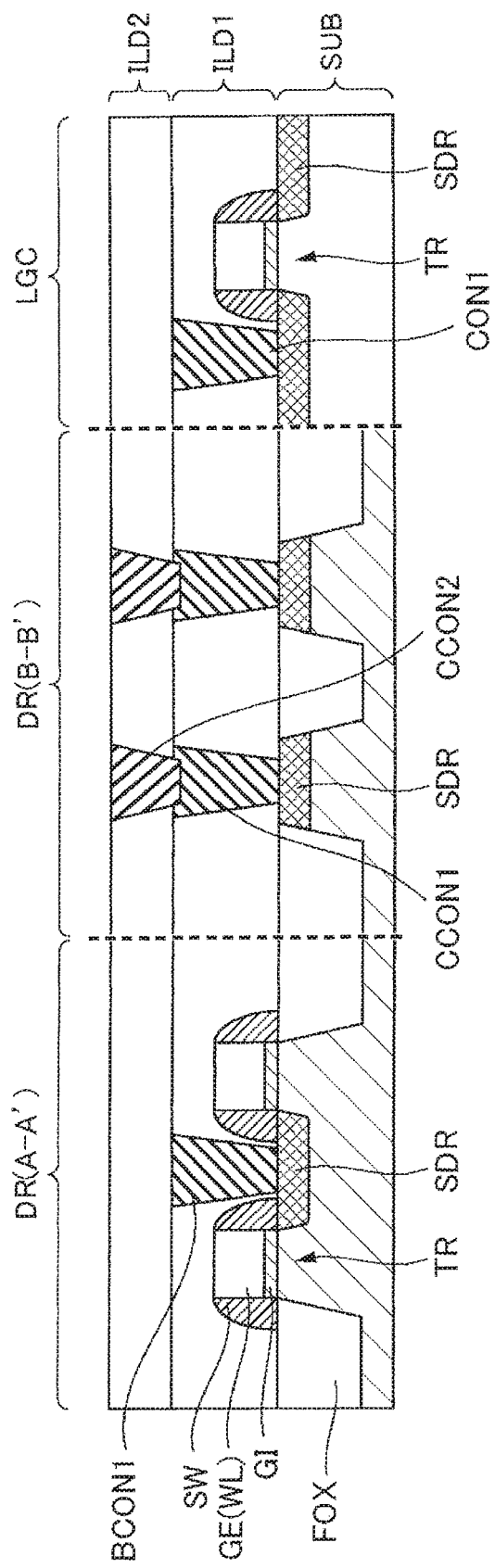
FIG. 8 is a view for describing the method of manufacturing the semiconductor device shown in FIGS. 3 to 6.

Next, as shown in FIG. 8, an interlayer insulating film ILD2 is formed on the interlayer insulating film ILD1. Then, coupling holes are formed in the interlayer insulating film ILD2. Next, in the DRAM region DR, a contact CCON2 is formed in these coupling holes. The contact CCON2 is coupled to the contact CCON1.

Figure 9:
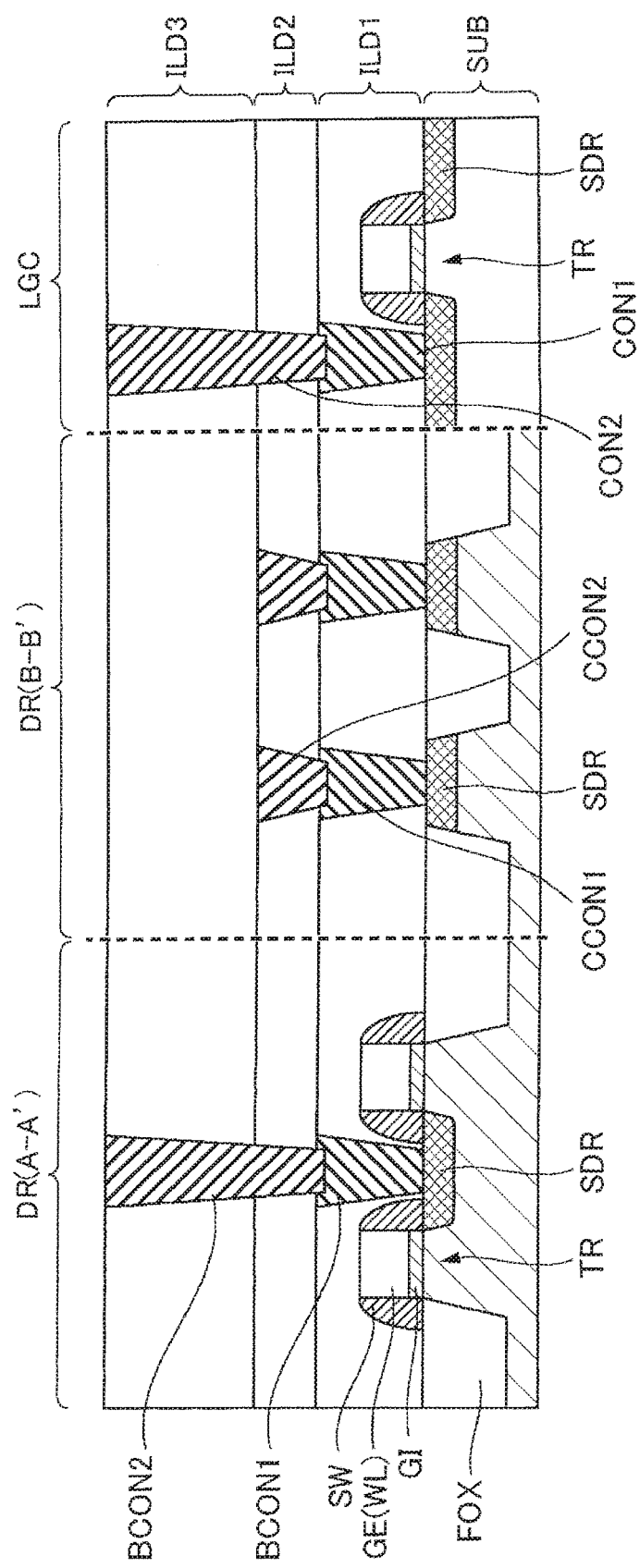
FIG. 9 is a view for describing the method of manufacturing the semiconductor device shown in FIGS. 3 to 6.

Next, as shown in FIG. 9, an interlayer insulating film ILD3 is formed on the interlayer insulating film ILD2. Coupling holes are made in the interlayer insulating film ILD3. These coupling holes penetrate through not only the interlayer insulating film ILD3 but also the interlayer insulating film ILD2. In the DRAM region DR, a contact BCON2 is formed in the coupling hole of this region. The contact BCON2 is coupled to the contact BCON1. In the logic region LGC, on the other hand, a contact CON2 is formed in the coupling hole of this region. The contact CON2 is coupled to the contact CON1.

Figure 10:
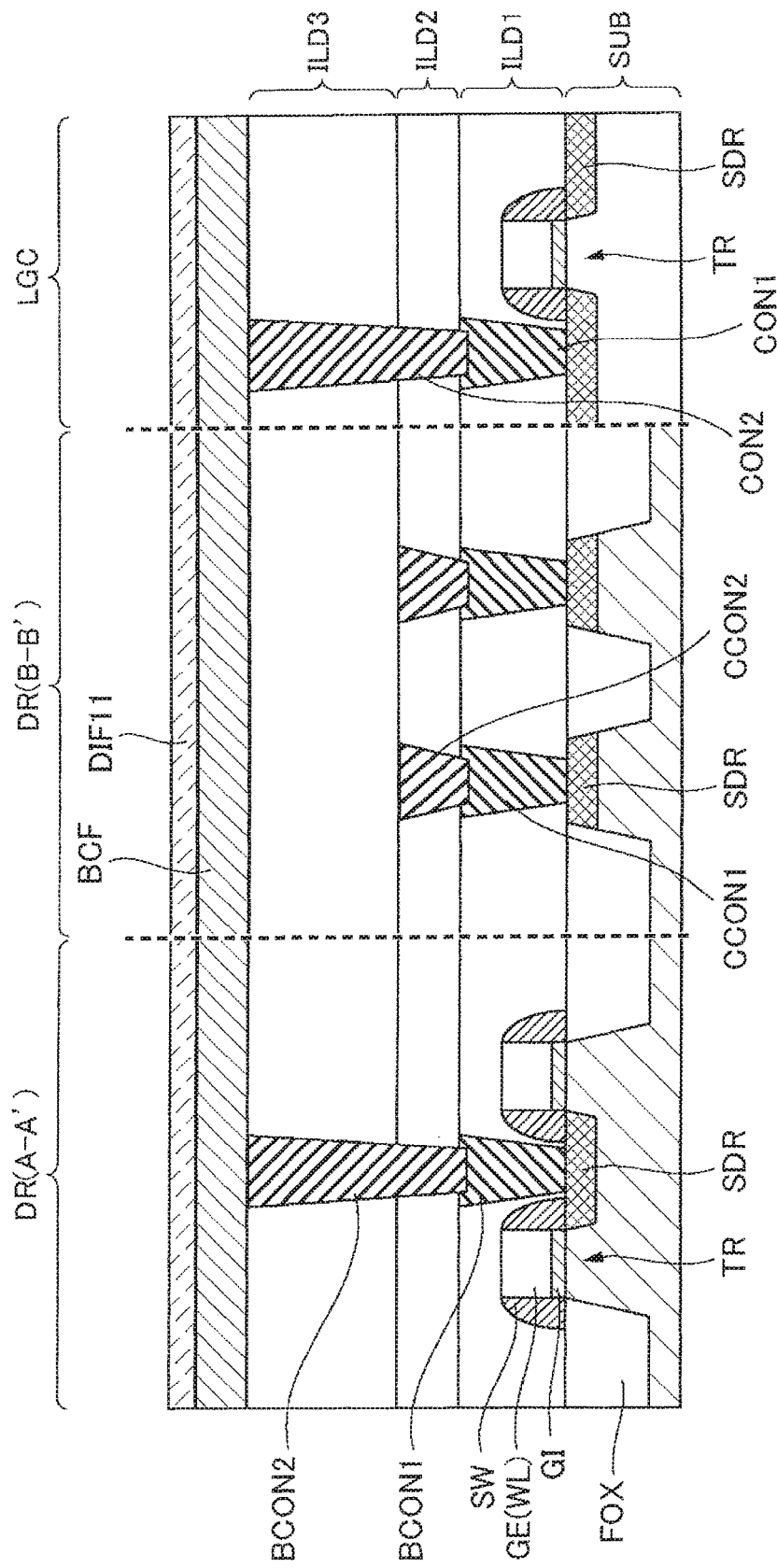
FIG. 10 is a view for describing the method of manufacturing the semiconductor device shown in FIGS. 3 to 6.

Next, as shown in FIG. 10, a conductive film BCF and an insulating film DIF11 are formed on the interlayer insulating film ILD3. The conductive film BCF is a conductive film to be a bit line BL. The insulating film DIF11 is an insulating film to be an isolation insulating film DIF1.

Figure 11:
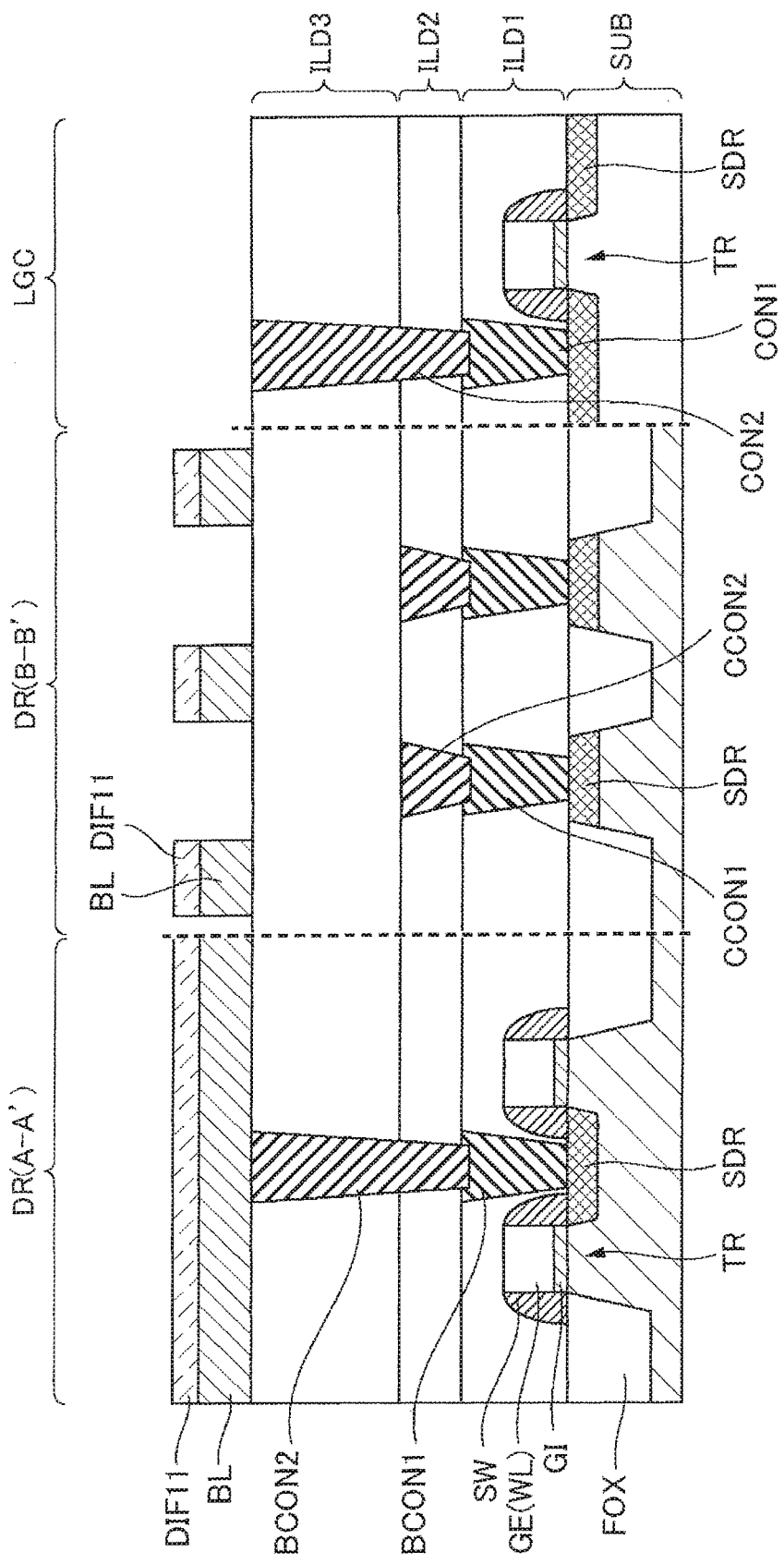
FIG. 11 is a view for describing the method of manufacturing the semiconductor device shown in FIGS. 3 to 6.

Next, as shown in FIG. 11, the conductive film BCF and the insulating film DIF11 are patterned by lithography. The conductive film BCF thereby becomes a bit line BL in the DRAM region DR. In the logic region LGC, on the other hand, the conductive film BCF and the insulating film DIF11 are removed. The insulating film DIF11 is therefore located only on the upper surface of the bit line BL. In other words, in this stage, the bit line BL has an exposed side surface.

Figure 12:
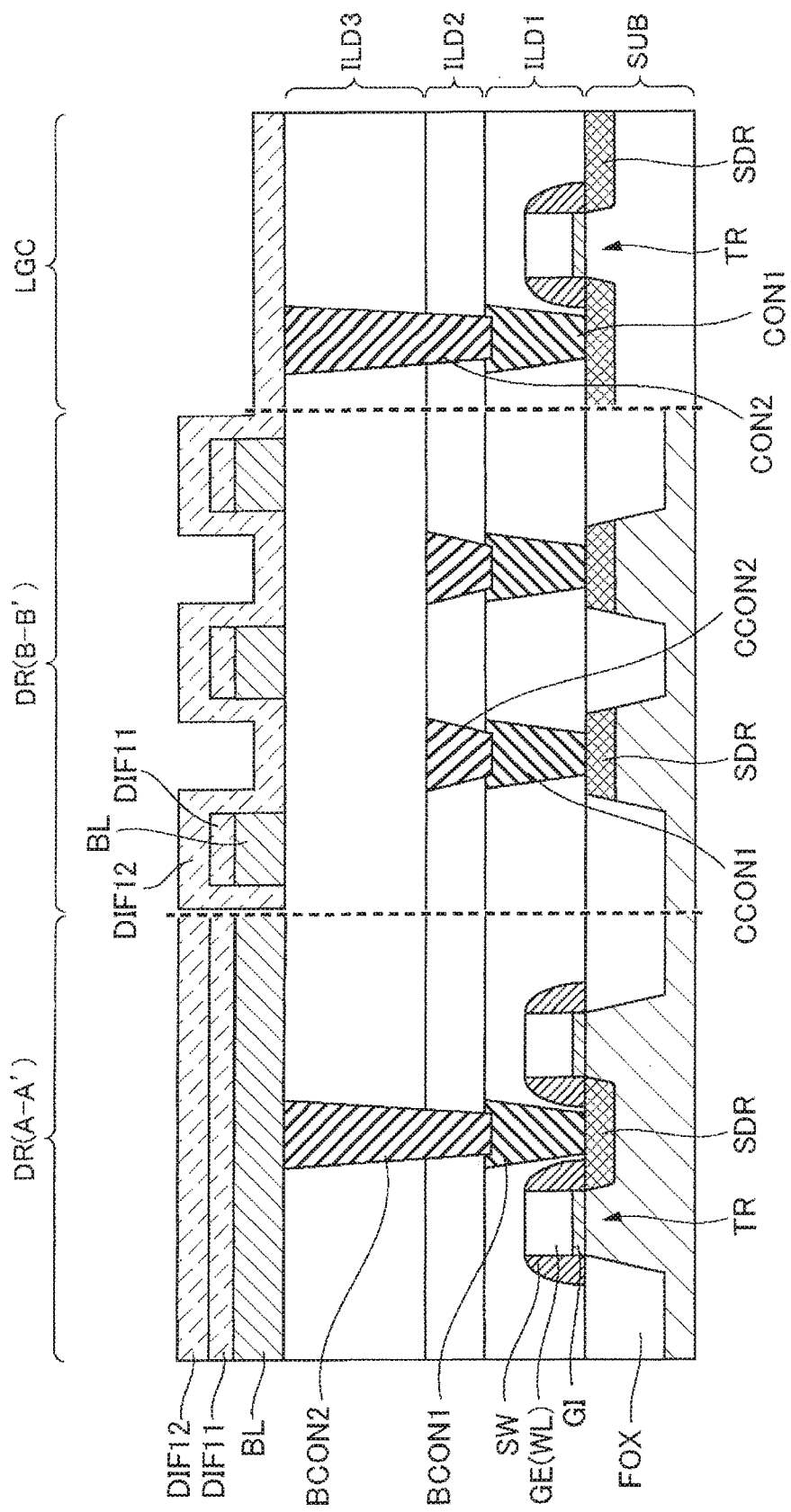
FIG. 12 is a view for describing the method of manufacturing the semiconductor device shown in FIGS. 3 to 6.

Next, as shown in FIG. 12, an insulating film DIF12 is formed on the interlayer insulating film ILD3. The insulating film DIF12 is an insulating film which will be an isolation insulating film DIF1. The insulating film DIF12 covers the bit line BL and the insulating film DIF11. In this case, the insulating film DIF12 extends across a plurality of the bit lines BL.

Figure 13:
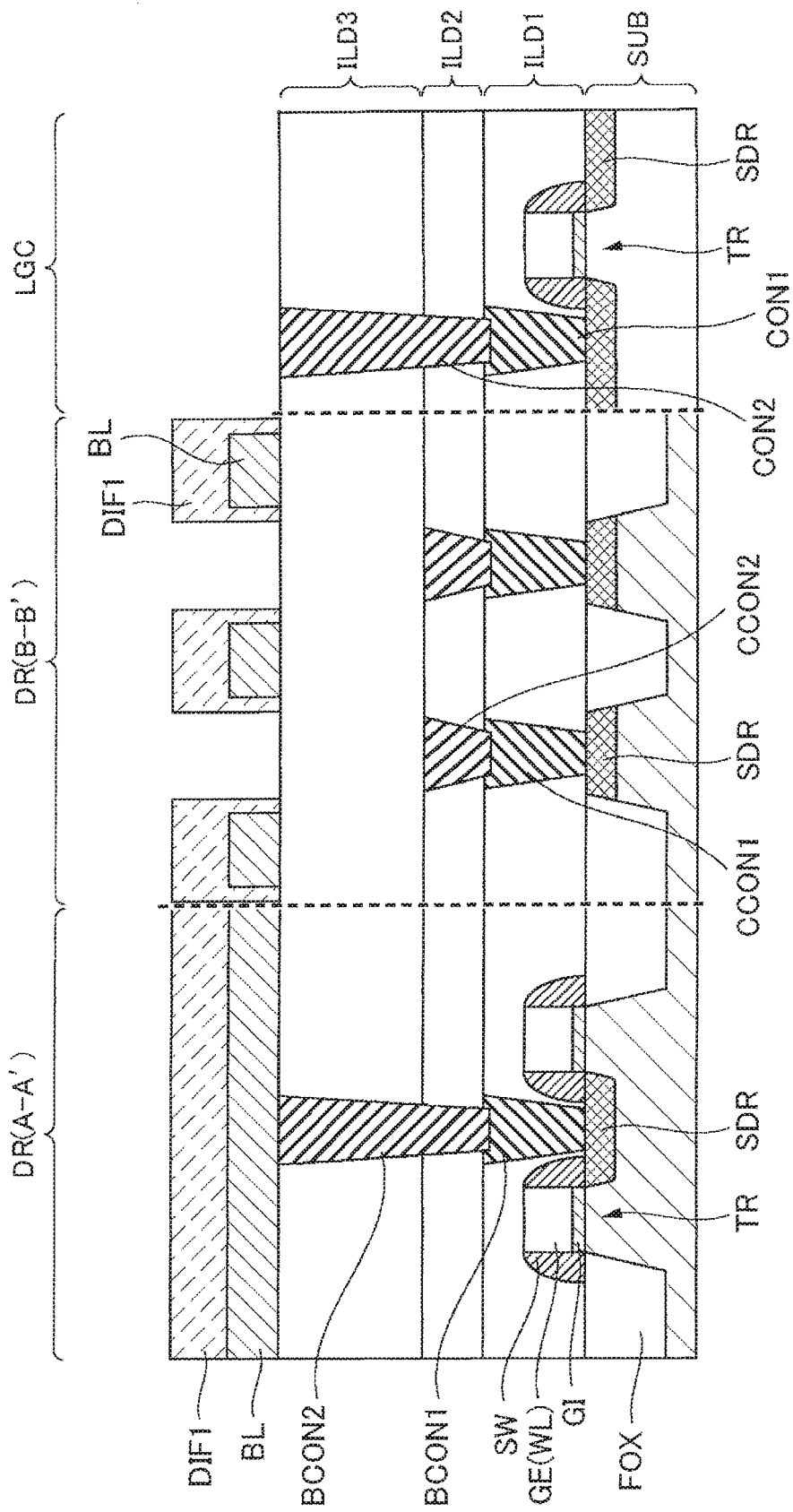
FIG. 13 is a view for describing the method of manufacturing the semiconductor device shown in FIGS. 3 to 6.

Next, as shown in FIG. 13, the insulating film DIF12 is removed by etch back. As a result, in the DRAM region DR, the insulating film DIF12 is separated for each of the bit lines BL. In the logic region LGC, on the other hand, the insulating film DIF12 is removed. In such a manner, in the DRAM region DR, the insulating films DIF11 and DIF12 configure the isolation insulating film DIF1. This isolation insulating film DIF1 has a linear shape along the bit line BL in plan view (FIG. 3). Further, in this case, the side surface of the bit line BL is covered with the isolation insulating film DIF1 (insulating film DIF12). In this drawing, an interface between the insulating films DIF11 and DIF12 is not shown for description. The isolation insulating film DIF1 however actually has an interface between the insulating films DIF11 and DIF12.

Figure 14:
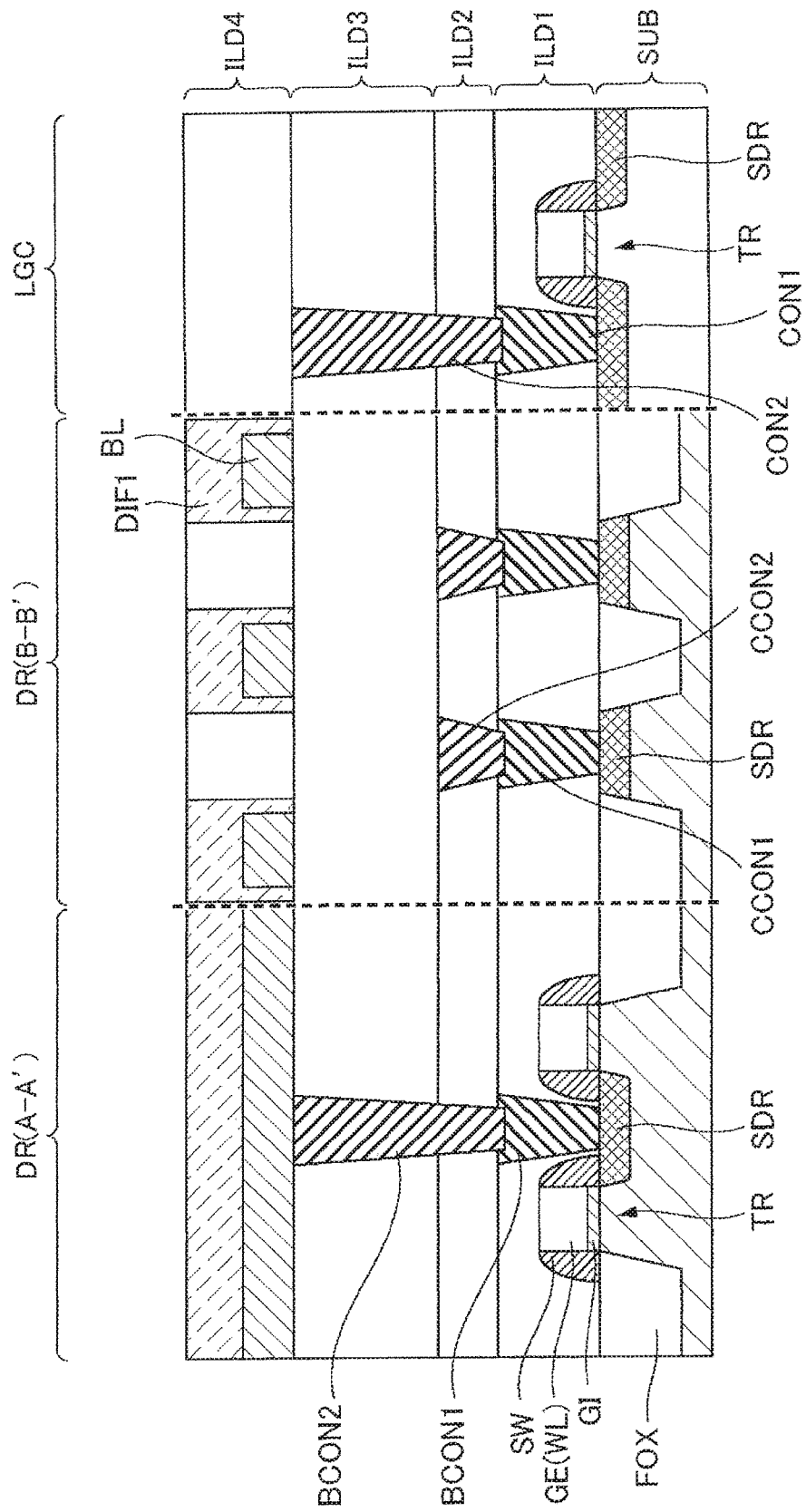
FIG. 14 is a view for describing the method of manufacturing the semiconductor device shown in FIGS. 3 to 6.

Next, as shown in FIG. 14, an interlayer insulating film ILD4 is formed on the interlayer insulating film ILD3. Next, the surface of the interlayer insulating film ILD4 is planarized, for example, by CMP (chemical mechanical polishing. As a result, the surface of the interlayer insulating film ILD4 is polished until exposure of the upper surface of the isolation insulating film DIF1. In this case, the surface of the interlayer insulating film ILD4 becomes flush with the upper surface of the isolation insulating film DIF1 smoothly without a step difference.

Figure 15:
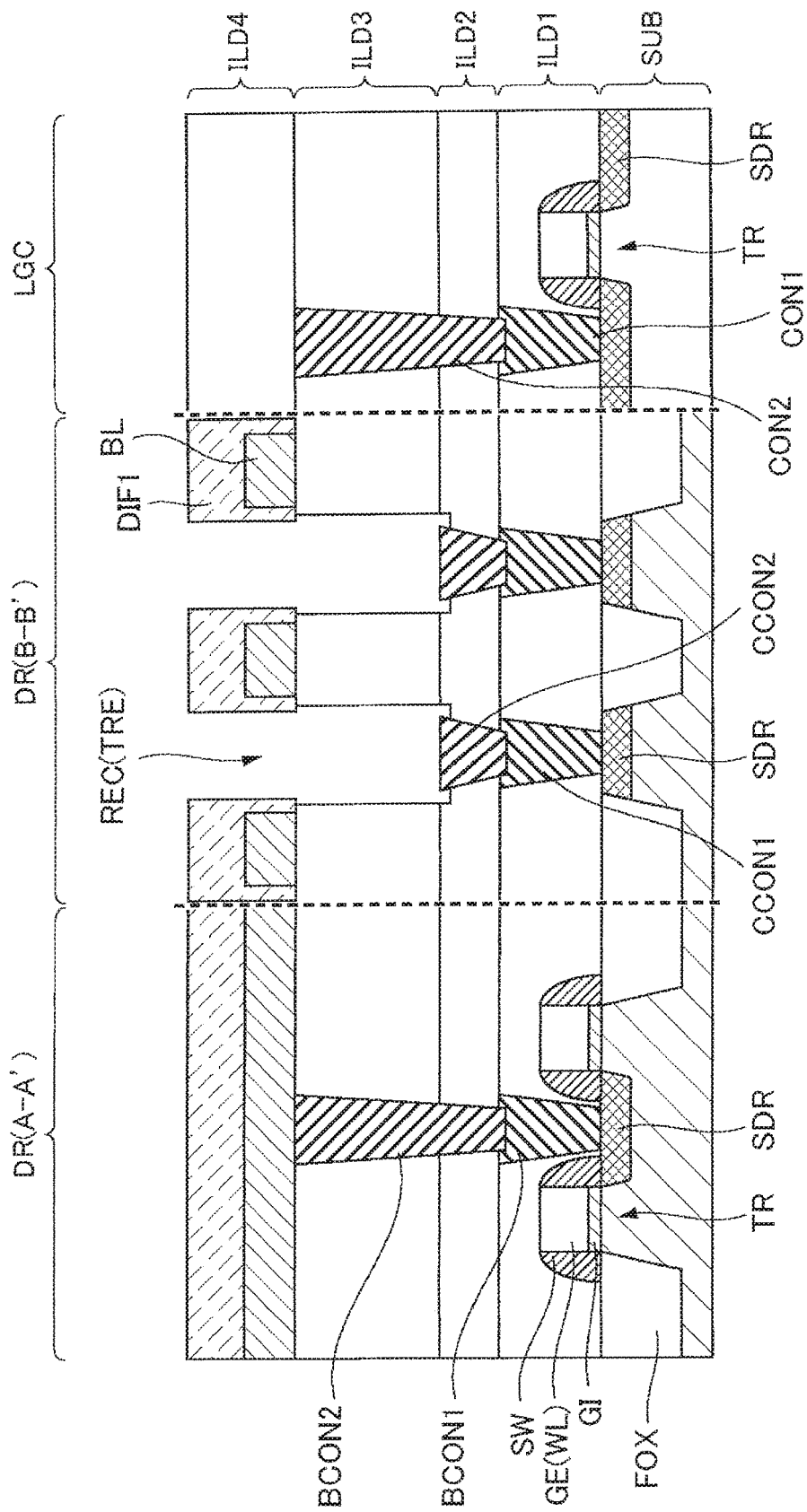
FIG. 15 is a view for describing the method of manufacturing the semiconductor device shown in FIGS. 3 to 6.

Next, as shown in FIG. 15, a trench TRE is formed in the interlayer insulating film ILD4 by lithography and dry etching. More specifically, a resist film (not illustrated) is formed on the surface of the interlayer insulating film ILD4. An opening is formed in the resist film by lithography. The resulting opening has a planar shape elongated in the third direction (ξ axis direction in FIG. 3). This opening intersects with a plurality of the isolation insulating films DIF1 in plan view without interruption at a portion where the isolation insulating film DIF1 is formed. Further, this opening includes therein a plurality of contacts CCON1 and CCON2 arranged along the third direction in plan view.

For example, with a fluorine-containing gas (for example, $CF_4$ gas), the interlayer insulating film ILD4 is dry etched. As a result, a trench TRE is formed on the surface of the interlayer insulating film ILD4. In this case, the isolation insulating film DIF1 functions as a hard mask for the interlayer insulating films ILD4 and ILD3. The trench TRE is therefore formed only between the isolation insulating films DIF1 adjacent to each other in plan view. The trench TRE thus formed partially becomes a recess REC. In other words, the recess REC is formed in self alignment.

Described specifically, the isolation insulating film DIF1 is made of a material which is not etched or hardly etched in spite that the interlayer insulating films ILD4 and ILD3 are etched. In other words, a selectivity (etch selectivity) of the interlayer insulating films ILD4 and ILD3 is large relative to the isolation insulating film DIF1. For example, when the interlayer insulating films ILD4 and ILD3 are made of a silicon oxide film ($SiO_2$), the isolation insulating film DIF1 is made of a silicon nitride film (SiN) or a silicon oxynitride film (SiON).

Figure 16:
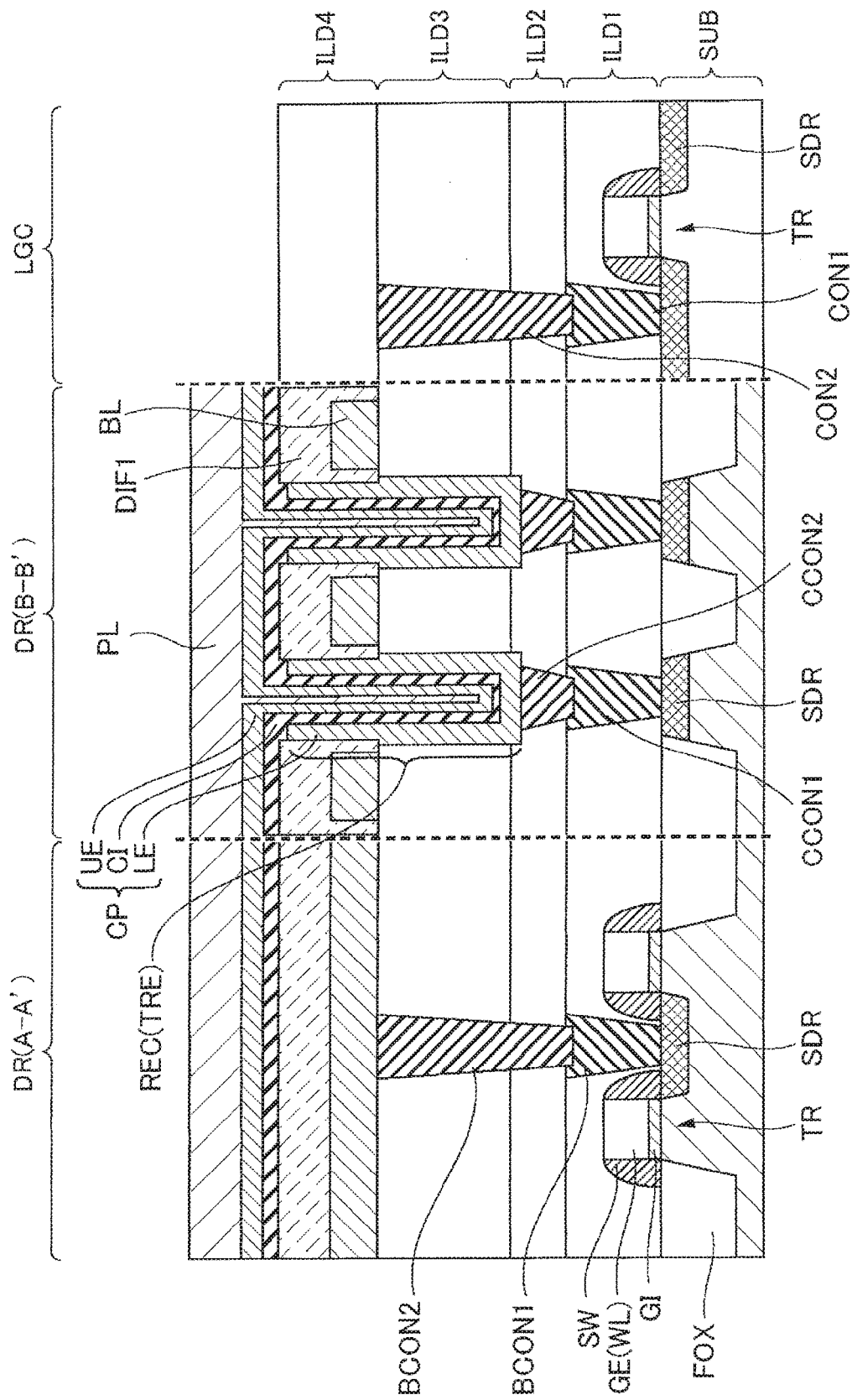
FIG. 16 is a view for describing the method of manufacturing the semiconductor device shown in FIGS. 3 to 6.

Next, as shown in FIG. 16, a lower electrode LE, a capacitor insulating film CI, and an upper electrode UE are formed. A capacitor CP is thus formed. Then, a conductive film PL is formed in the DRAM region DR.

Figure 17:
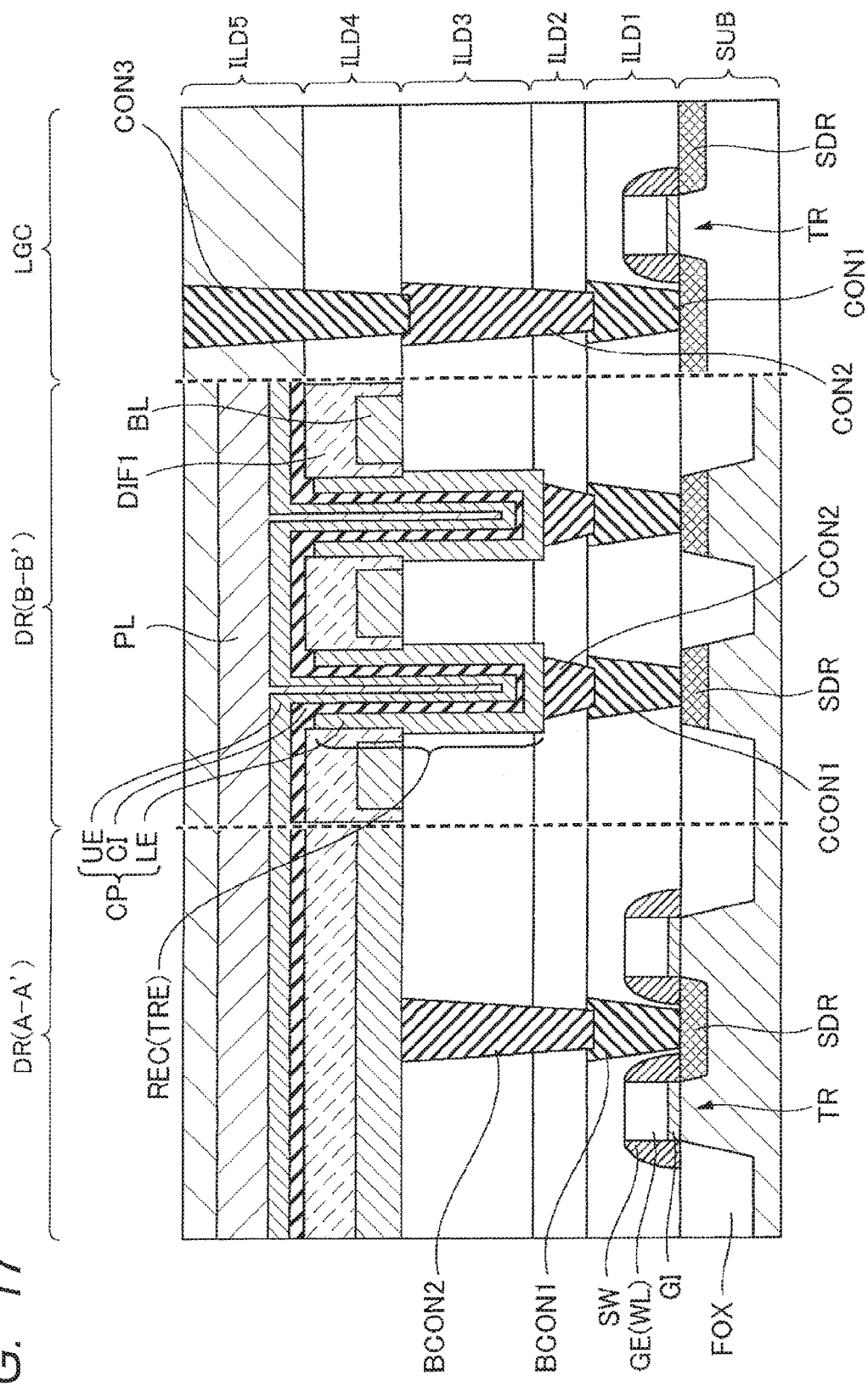
FIG. 17 is a view for describing the method of manufacturing the semiconductor device shown in FIGS. 3 to 6.

Next, as shown in FIG. 17, an interlayer insulating film ILD5 is formed on the interlayer insulating film ILD4. In the logic region LGC, a coupling hole is formed in the interlayer insulating film ILD5. This coupling hole penetrates through not only the interlayer insulating film ILD5 but also the interlayer insulating film ILD4. In this coupling hole, a contact CON3 is formed. The contact CON3 is coupled to the contact CON2 (contact formed in the interlayer insulating films ILD2 and ILD3). The conductive film PL and the contact CON3 can be coupled via a wiring (not illustrated) formed in an interlayer insulating film on the interlayer insulating film ILD5. In such a manner, the semiconductor device SD is manufactured.

In the example shown in this drawing, the logic region LGC has only the contacts (contacts CON2 and CON3) in the interlayer insulating films (interlayer insulating films ILD3 and ILD4) through which the recess REC penetrates, but the structure of the logic region LGC is not limited to it. For example, the logic region LGC may have, in each of the interlayer insulating films through which the recess REC penetrates, a wiring linearly extending in plan view or a contact (via) coupled to the bottom surface of this wiring. Such a wiring and contact are formed, for example, by dual damascene.

Next, the effect and advantage of the present embodiment will be described. According to the present embodiment, when the recess REC is formed in the interlayer insulating films ILD4 and ILD3, the isolation insulating film DIF1 functions as a hard mask against the interlayer insulating films ILD4 and ILD3. The recess REC is therefore formed in self alignment. As a result, the recesses REC (capacitors CP) adjacent to each other can be separated effectively via the isolation insulating film DIF1 in plan view. The shape of the isolation insulating film DIF1 does not easily collapse at the time of formation of the recess REC. This makes it possible to prevent the lower electrode LE of the capacitor CP from extending across the recesses REC adjacent to each other via the isolation insulating film DIF1. As a result, short circuit between the lower electrodes LE of the capacitors CP adjacent to each other via the isolation insulating film DIF1 can be prevented effectively.

Further, according to the present embodiment, the isolation insulating film DIF1 covers the bit line BL. In this case, lithography for forming the isolation insulating film DIF1 and lithography for forming the bit line BL are not necessarily performed separately. More specifically, as shown in FIG. 11, the insulating film DIF11 (isolation insulating film DIF1) and the bit line BL are formed simultaneously by single lithography (the isolation insulating film DIF1 (insulating film DIF12) covering the side surface of the bit line BL is formed by etch back as shown in FIG. 13 so that lithography is not necessary for the formation of the insulating film DIF12). This makes it possible to prevent an increase in the number of lithography steps.

Further, in the present embodiment, the isolation insulating film DIF1 fulfills the function of separating the recesses REC adjacent to each other and at the same time, fulfills the function of covering the bit line BL. In this case, the bit line BL, together with the isolation insulating film DIF1, is located in a region which overlaps with the recess REC, when viewed from a direction perpendicular to the thickness direction of the wiring layer IL.

Modification Example 1

Figure 18:
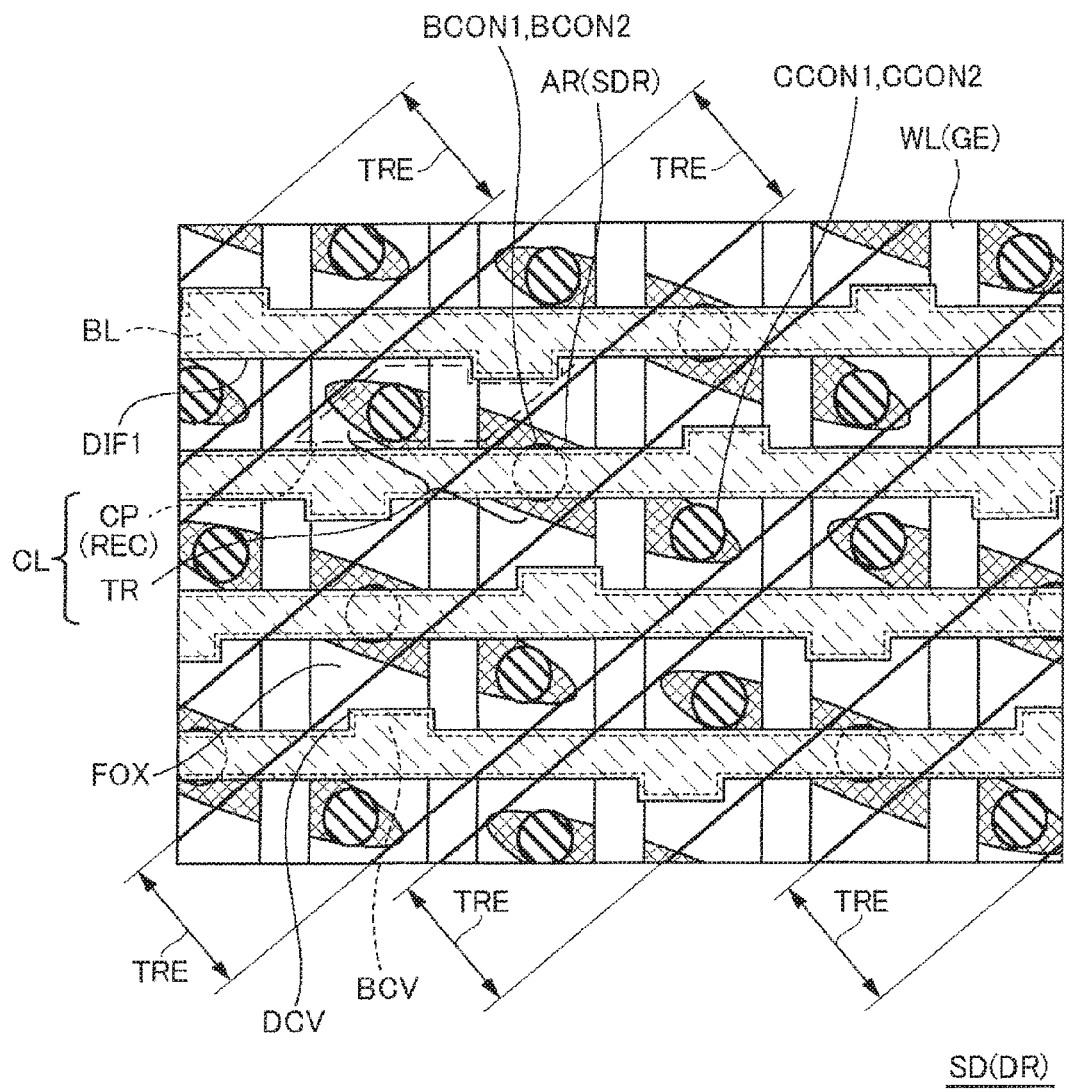
FIG. 18 is a plan view showing a portion of a DRAM region of a semiconductor device of Modification Example 1.

FIG. 18 is a plan view showing a portion of a DRAM region DR of a semiconductor device SD according to Modification Example 1 and corresponds to FIG. 3 of the embodiment. The semiconductor device SD of the present modification example has a configuration similar to that of the semiconductor device SD of the present embodiment except for the following point.

In the present modification example, the isolation insulating film DIF1 has a protrusion DCV that protrudes from the side surface of the isolation insulating film DIF1 in plan view. At least a portion of this protrusion DCV overlaps with the recess REC, when viewed from the third direction (ξ axis direction in FIG. 3). More specifically, the bit line BL has, on the side surface thereof, a plurality of protrusions BCV. As described above, the isolation insulating film DIF1 covers the bit line BL. In this case, the planar shape of the isolation insulating film DIF1 changes along the planar shape of the bit line BL so that the shape of the protrusion DCV follows the shape of the protrusion BCV.

According to the present modification example, when the capacitor CP is formed in the recess REC, the side surface of the capacitor CP has a greater surface area compared with the case where the isolation insulating film does not have the protrusion DCV. The capacitor CP can therefore have a greater static capacitance compared with the case where the isolation insulating film does not have the protrusion DCV.

Modification Example 2

Figure 19:
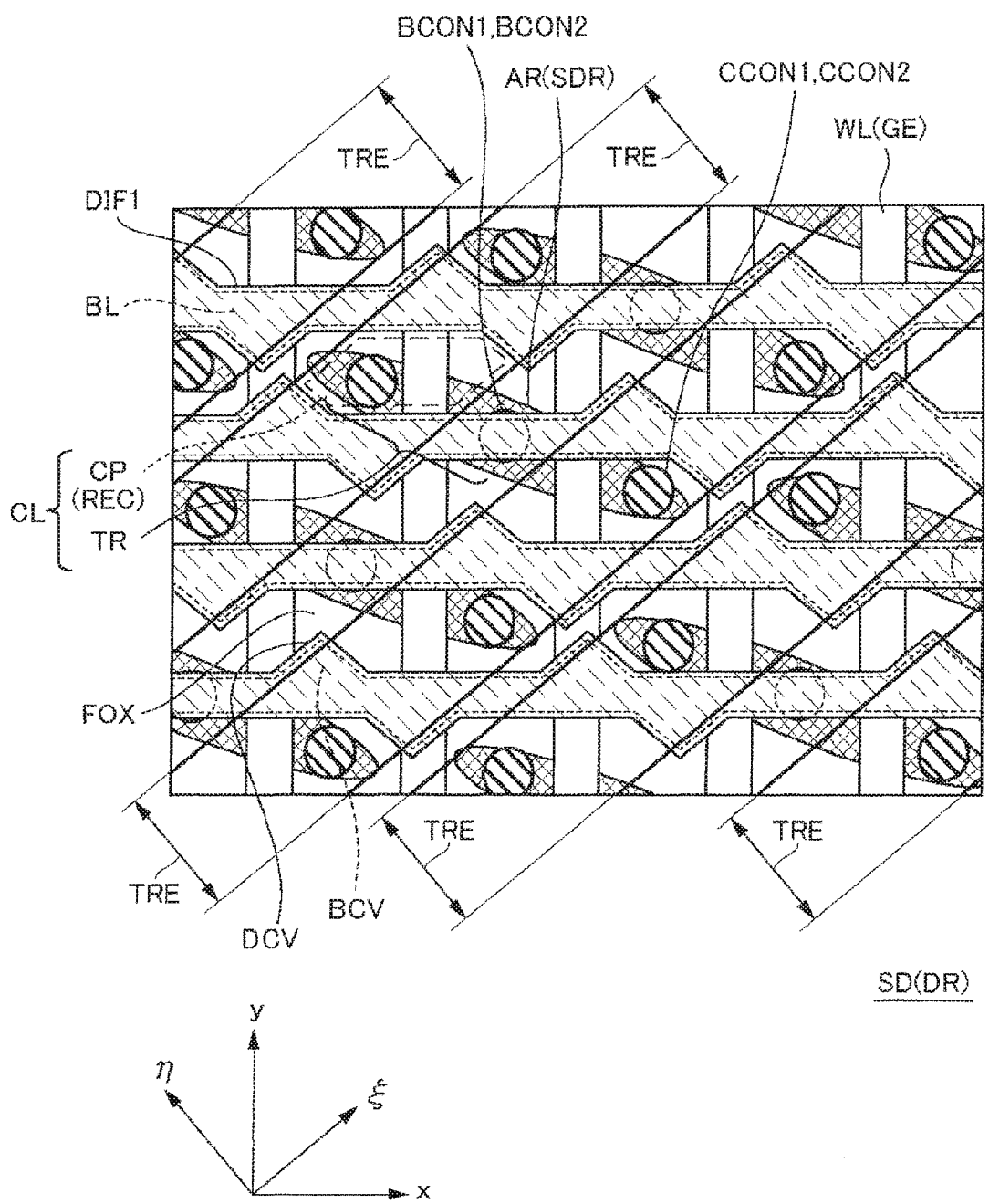
FIG. 19 is a plan view showing a portion of a DRAM region of a semiconductor device of Modification Example 2.

FIG. 19 is a plan view showing a portion of the DRAM region DR of a semiconductor device SD according to Modification Example 2 and corresponds to FIG. 18 of Modification Example 1. The semiconductor device SD of the present modification example has a configuration similar to that of the semiconductor device SD of Modification Example 1 except for the following point.

In the present modification example, the protrusion DCV is located so as to chamfer an acute angle, among angles formed by the inner surfaces of the recess REC intersecting with each other in plan view. The acute angle, among the angles formed by the inner surface of the recess REC (capacitor CP) in plan view, can be made more obtuse. Electric field concentration is likely to occur at an acute angle and in such a region where electric field concentration occurs, current leakage is likely to occur. In the present modification example, on the other hand, such electric field concentration can be suppressed.

In the example shown in this drawing, the protrusion BCV (protrusion DCV) has a planar shape whose width narrows as it is more distant from the isolation insulating film DIF1.

The angle at the tip of the protrusion BCV (protrusion DCV) is located outside the recess REC in plan view. Thus, an acute angle, among angles formed by the inner surfaces of the recess REC which intersect with each other, is chamfered. In this case, the angle formed by the intersection between the side surface of the protrusion DCV and the inner surface of the recess REC is preferably obtuse in plan view. In this case, suppression of electric field concentration can be actualized more effectively. The planar shape of the protrusion BCV (protrusion DCV) is not limited to the example shown in this drawing.

Modification Example 3

Figure 20:
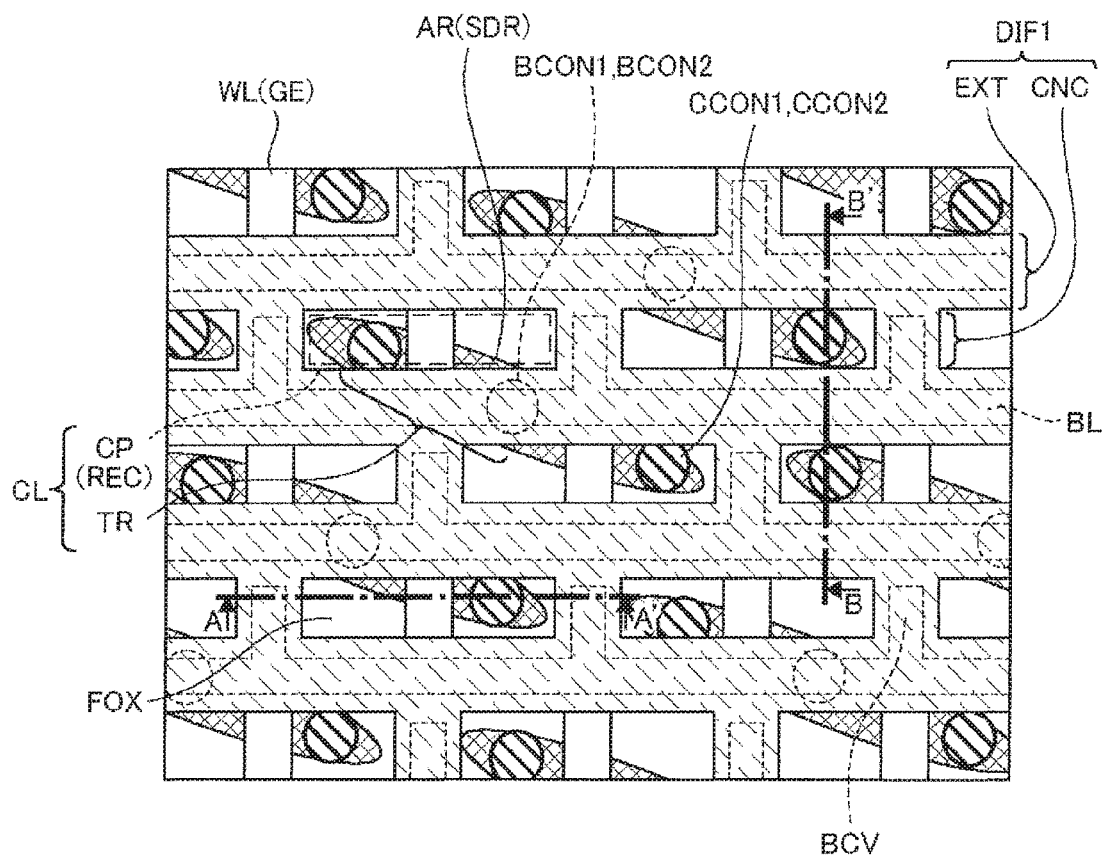
FIG. 20 is a plan view showing a portion of a DRAM region of a semiconductor device of Modification Example 3.
Figure 21:
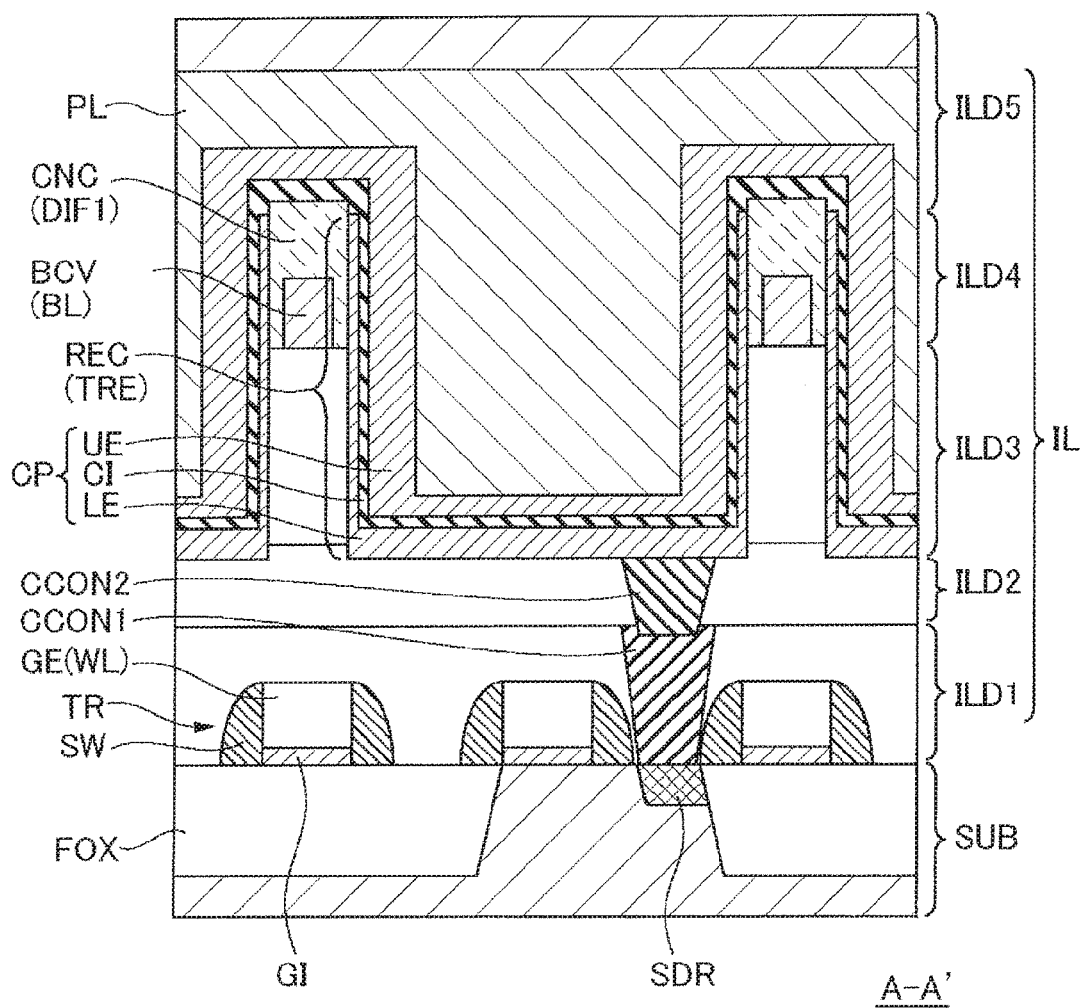
FIG. 21 is an A-A' cross-sectional view of FIG. 20.
Figure 22:
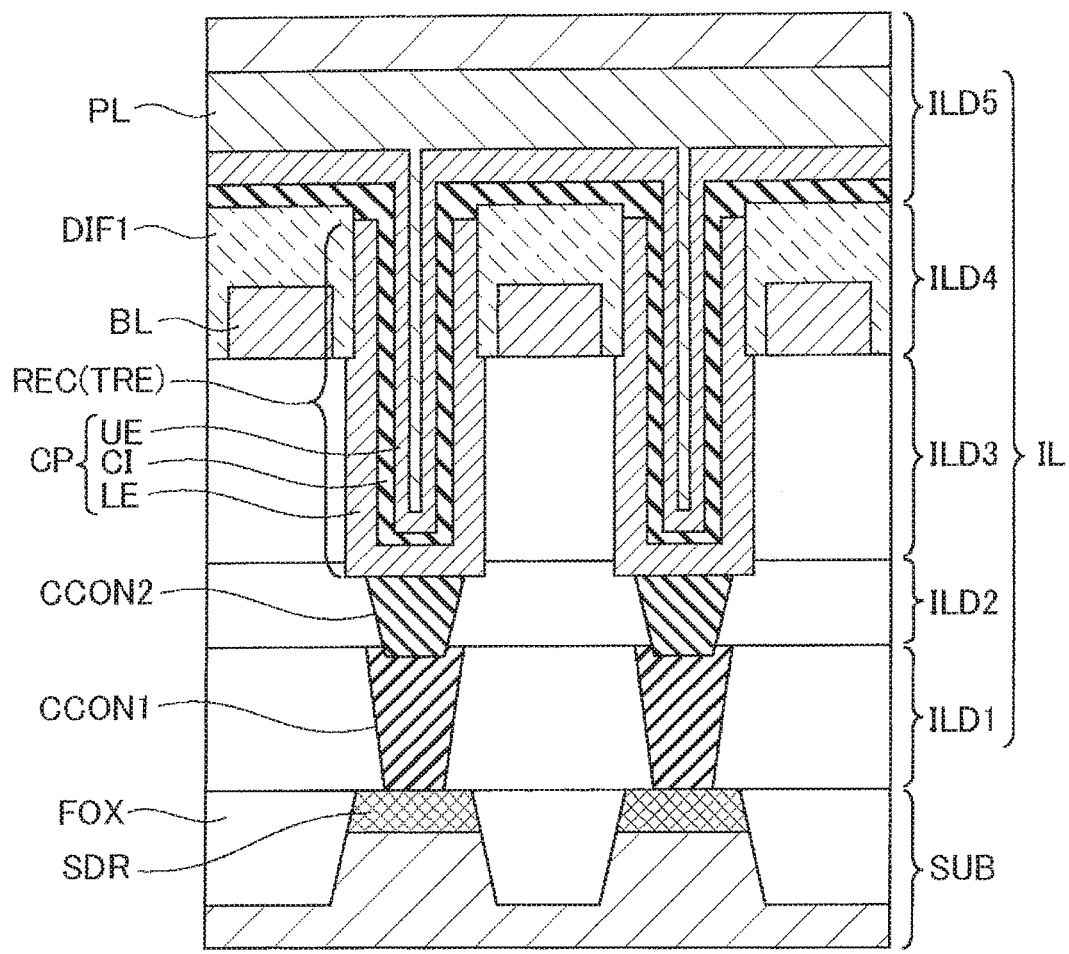
FIG. 22 is a B-B' cross-sectional view of FIG. 20.

FIG. 20 is a plan view showing a portion of a DRAM region DR of a semiconductor device SD of Modification Example 3 and corresponds to FIG. 3 of the embodiment. FIG. 21 is an A-A' cross-sectional view of FIG. 20. FIG. 22 is a B-B' cross-sectional view. The semiconductor device SD of the present modification example has a configuration similar to that of the semiconductor device SD of the embodiment except for the following point.

In the modification example, the isolation insulating film DIF1 is comprised of a plurality of extension portions EXT and a plurality of coupling portions CNC. The extension portions EXT each extend in a first direction (x axis direction in FIG. 20) in plan view and these extension portions EXT are arranged along a second direction (y axis direction in FIG. 20). The coupling portions CNC couple extension portions EXT adjacent to each other. These coupling portions CN are arranged along the first direction (x axis direction in FIG. 20) between the coupling portions CNC adjacent to each other.

As shown in FIGS. 21 and 22, the wiring layer IL includes a recess EC. A capacitor CP is formed in the recess REC. The recess REC has an opening in the surface of the interlayer insulating film ILD4. A plurality of the recesses REC is separated from each other by the extension portions EXT and the coupling portions CNC (isolation insulating film DIF1). These recesses REC are arranged so as to be placed respectively on lattice points of an oblique lattice made of a plurality of straight lines extending along the first direction (x axis direction in FIG. 20) and a plurality of straight lines extending along the third direction (ξ axis direction in FIG. 20). Further, in this case, the recesses REC are provided so as to correspond to the contacts CCON1 and CCON2, respectively, in plan view. In the example shown in these drawings, the recesses REC each have a rectangular planar shape.

Described specifically, as shown in FIG. 20, the bit line BL has, on the side surface thereof, the protrusion BCV. The protrusion BCV is not in contact with the bit line BL adjacent thereto. The bit lines BL adjacent to each other are not coupled via the protrusion BCV. On the other hand, the protrusion BCV protrudes from the side surface of the bit line BL to such a degree that the coupling portion CNC (a portion of the isolation insulating film DIF1) couples the extension portions EXT (a portion of the isolation insulating film DIF1) adjacent to each other. This means that the planar shape of the isolation insulating film DIF1 substantially follows the planar shape of the bit line BL. When the distance between the tip of the protrusion BCV and the bit line BL adjacent thereto is to some extent short, the coupling portion CNC (isolation insulating film DIF1) can couple the extension portions EXT adjacent to each other. More specifically, the tip of the protrusion BCV and the bit line BL adjacent thereto are opposed to each other with a distance substantially equal to or about twice the thickness of the isolation insulating film DIF1 formed on the upper surface of the bit line BL.

According to the present modification example, by applying dry etching to the entire surface of the interlayer insulating film ILD4 while having the isolation insulating film DIF1 (coupling portion CNC and extension portion EXT), a plurality of recesses REC can be formed. In other words, lithography (formation of a resist film) for separating the recesses REC becomes unnecessary.

Further, according to the present modification example, the recess REC can have a rectangular planar shape. In this case, the recess REC has, in the planar shape thereof, no acute angle on which electric field is likely to concentrate. This makes it possible to suppress electric field concentration on the side surface of the capacitor CP (recess REC).

Modification Example 4

Figure 23:
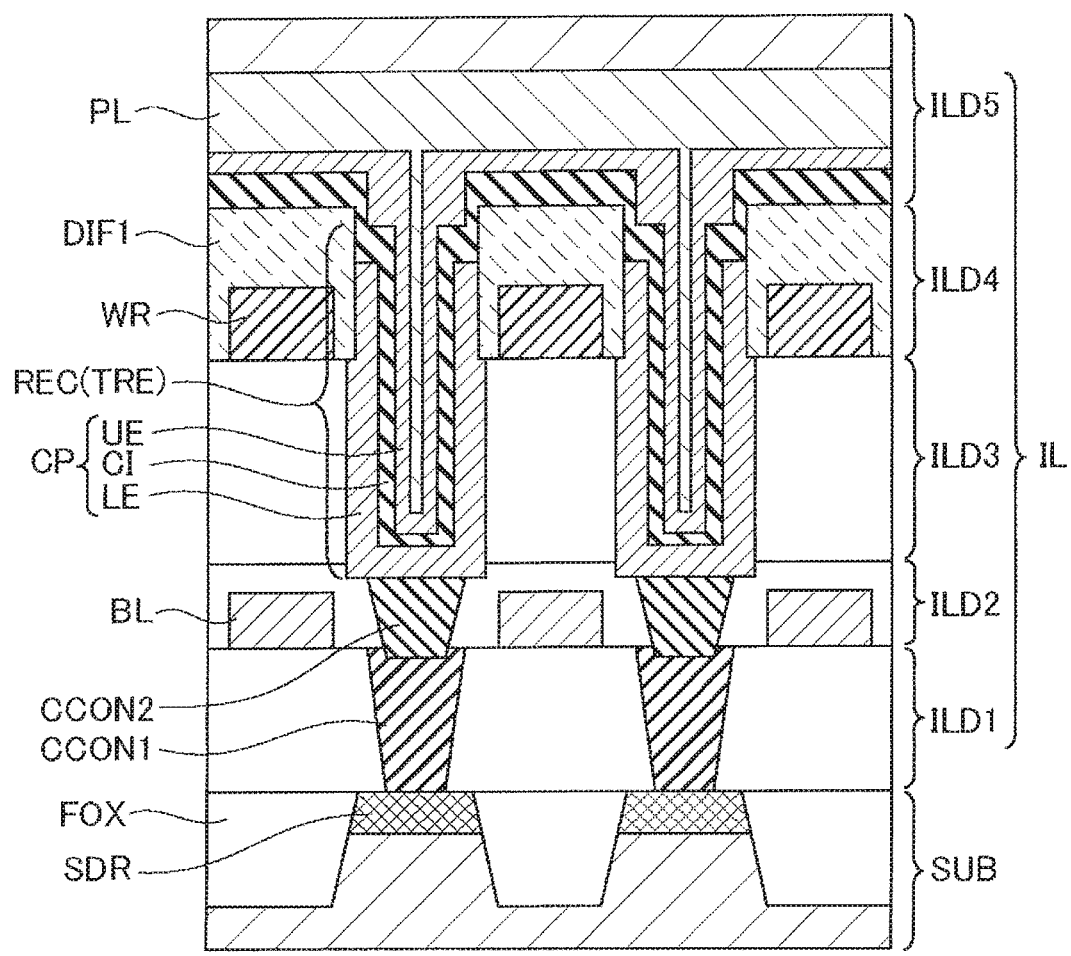
FIG. 23 is a cross-sectional view of a semiconductor device of Modification Example 4.

FIG. 23 is a cross-sectional view of a semiconductor device SD according to Modification Example 4 and corresponds to FIG. 5 of the embodiment. The semiconductor device SD of the present modification example has a configuration similar to that of the semiconductor device SD of the embodiment except for the following point.

In the present modification example, the bit line BL underlies the capacitor CP (recess REC). More specifically, the bit line BL is located in the interlayer insulating film ILD2. Still more specifically, the bit line BL is located on the surface of the interlayer insulating film ILD1 and is covered with the interlayer insulating film ILD2. In the present modification example, the isolation insulating film DIF1 covers the wiring WR. In other words, in a region where the bit line BL is formed in the embodiment, the bit line BL is replaced by the wiring WR. The wiring WR is a wiring different from the bit line BL. In other words, the wiring WR is a wiring not directly coupled to the source/drain region SDR of the transistor TR via a contact. The wiring WR configures, for example the circuit of the DRAM region DR.

Also in the present modification example, similar to the embodiment, recesses REC adjacent to each other in plan view via the isolation insulating film DIF1 can be separated effectively. The layer where the bit line BL is formed is not limited to the example (layer below the capacitor CP) shown in the drawing. For example, the bit line BL may be formed as an upper layer on the capacitor CP.

Modification Example 5

Figure 24:
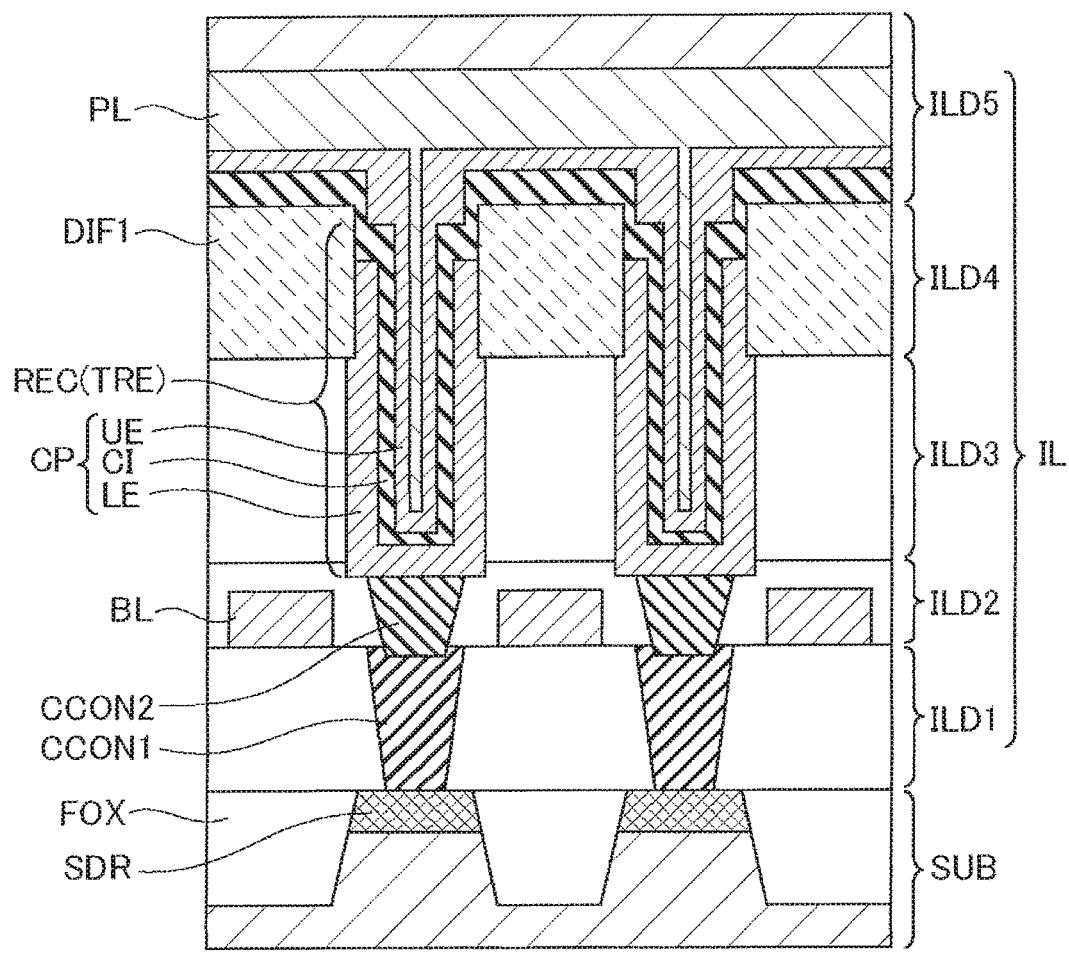
FIG. 24 is a cross-sectional view of a semiconductor device of Modification Example 5.

FIG. 24 is a cross-sectional view of a semiconductor device SD of Modification Example 5 and corresponds to FIG. 23 of Modification Example 4. The semiconductor device SD of the present modification example has a configuration similar to that of the semiconductor device SD of Modification Example 4 except for the following point.

In the present modification example, the isolation insulating film DIF1 does not cover any wiring (for example, bit line BL). In other words, in the present modification example, the isolation insulating film DIF1 does not fulfill the function of covering a wiring. Even in such a case, recesses REC adjacent to each other via the isolation insulating film DIF1 in plan view can be separated effectively as in Modification Example 4 (embodiment).

Modification Example 6

Figure 25:
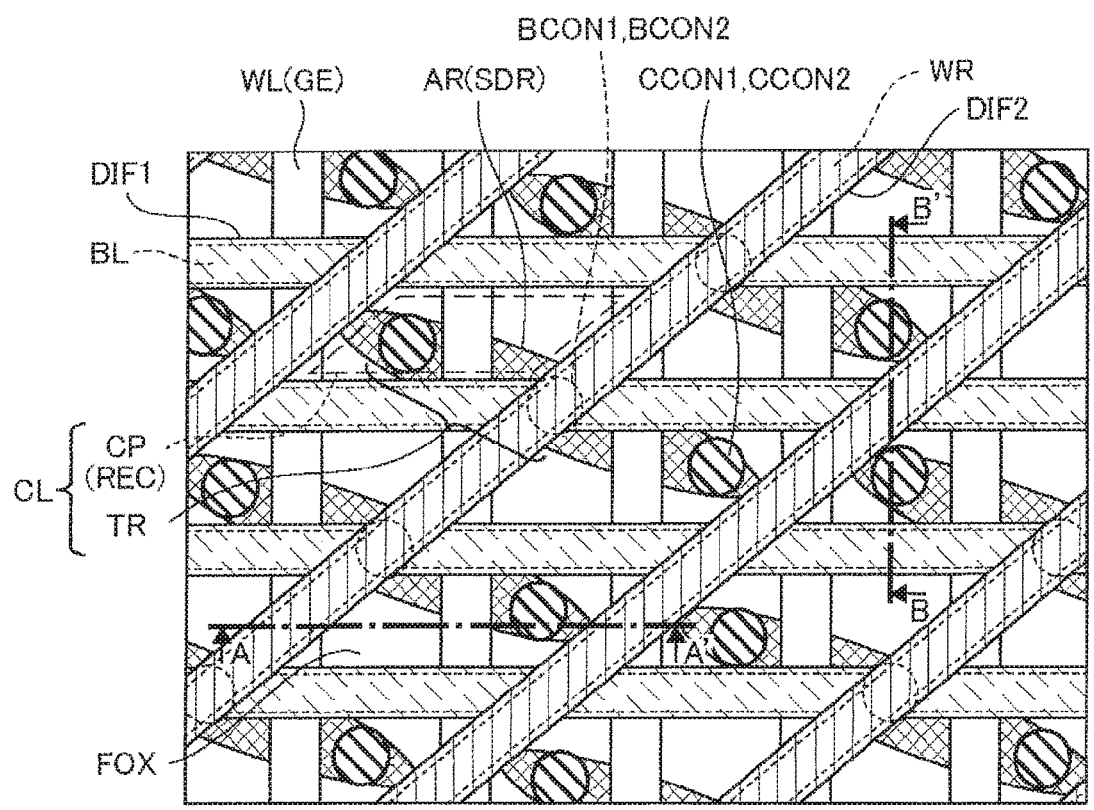
FIG. 25 is a plan view showing a portion of a DRAM region of a semiconductor device of Modification Example 6.
Figure 25:
Figure 26:
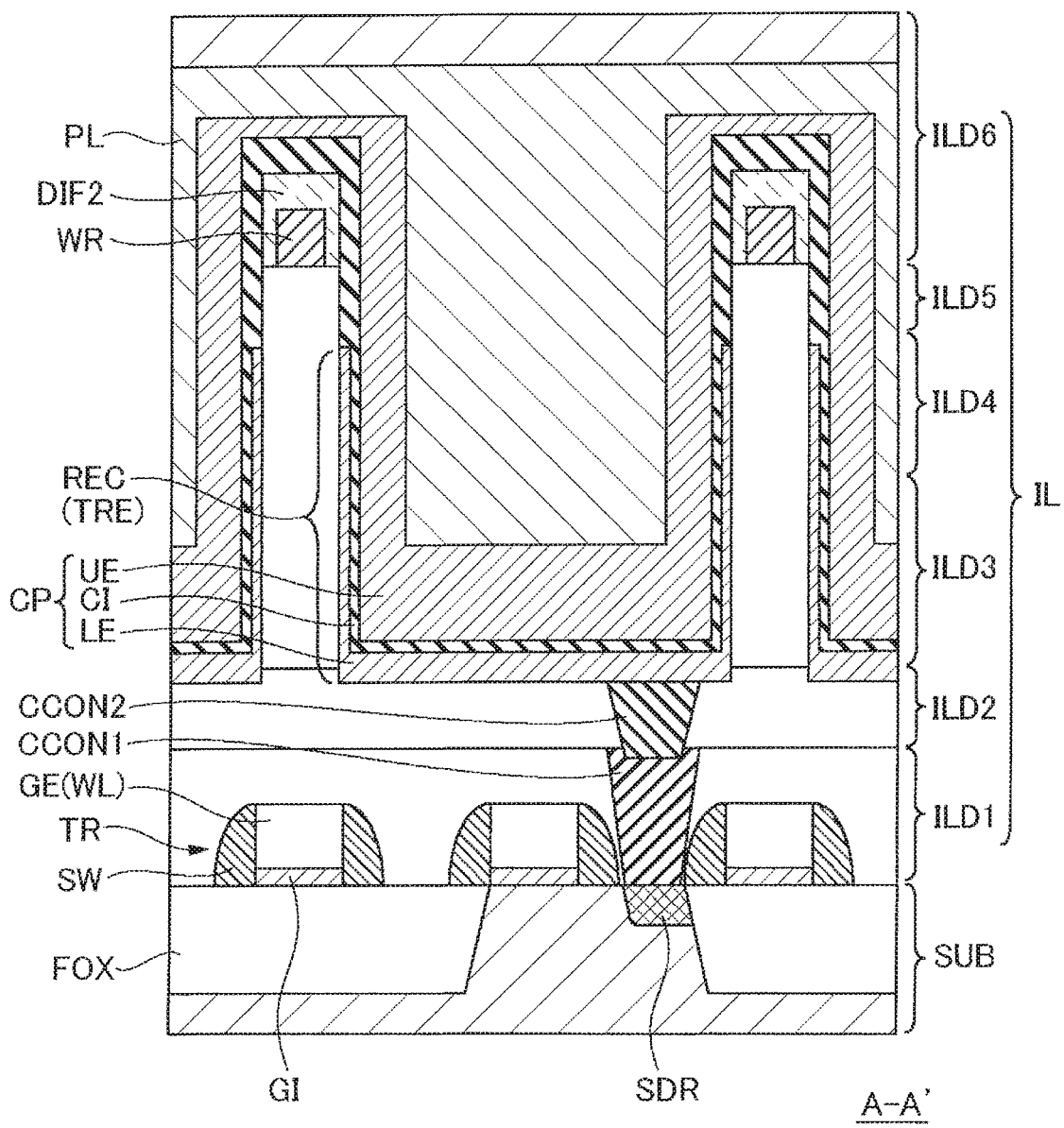
FIG. 26 is an A-A' cross-sectional view of FIG. 25.
Figure 27:
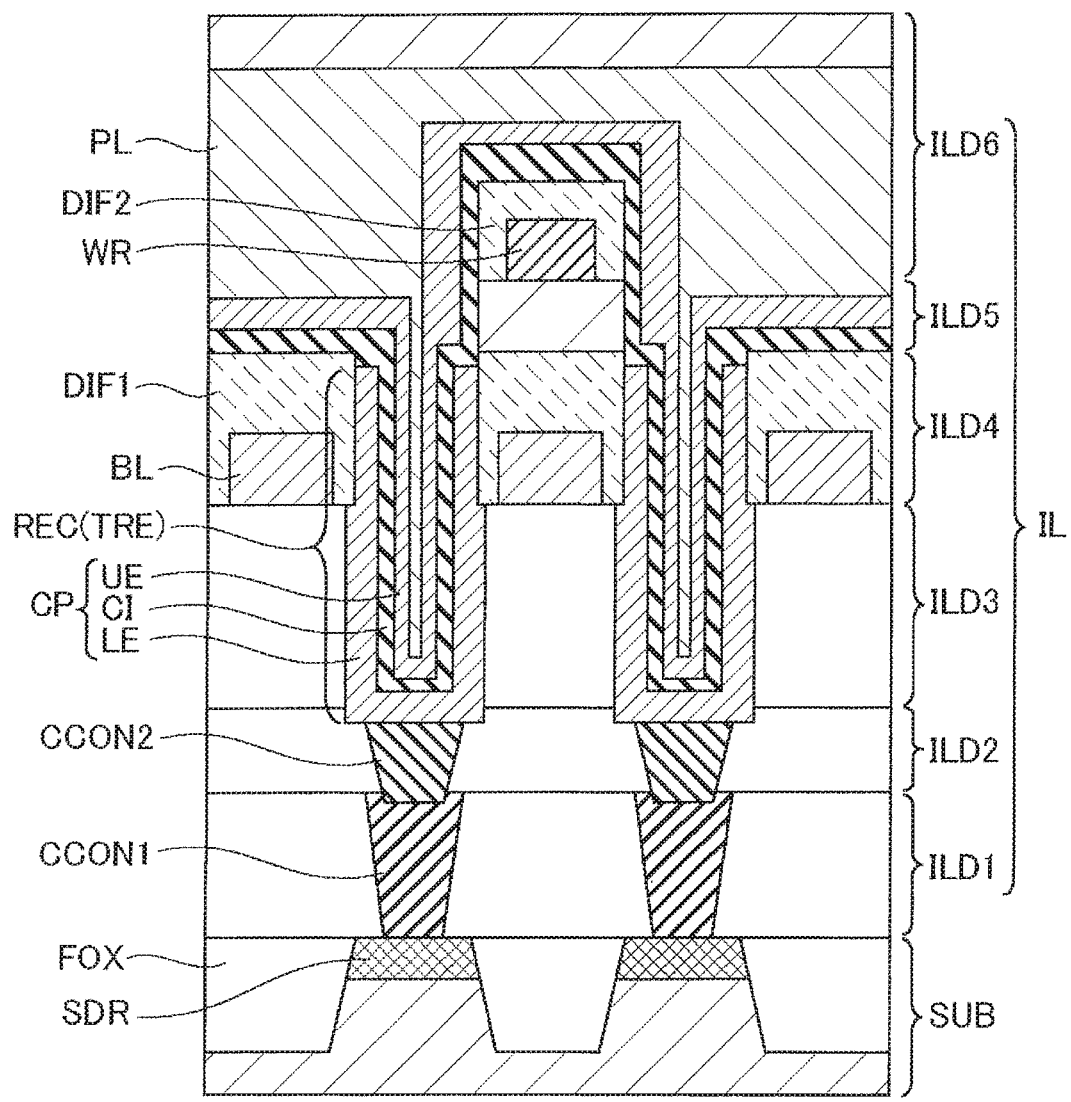
FIG. 27 is a B-B' cross-sectional view of FIG. 25.

FIG. 25 is a plan view showing a portion of a DRAM region DR of a semiconductor device SD of Modification Example 6 and corresponds to FIG. 3 of the embodiment. FIG. 26 is an A-A' cross-sectional view of FIG. 25. FIG. 27 is a B-B' cross-sectional view of FIG. 25. The semiconductor device SD of the present modification example has a configuration similar to the semiconductor device SD of the embodiment except for the following point.

In the present modification example, an interlayer insulating film ILD4 (an interlayer insulating film having thereon an isolation insulating film DIF1) has thereon an interlayer insulating film ILD5 (second interlayer insulating film). The interlayer insulating film ILD5 has thereon an isolation insulating film DIF2 (second isolation insulating film). The isolation insulating film DIF2 extends in a third direction ($\xi$ axis direction in FIG. 25) and obliquely crosses with the isolation insulating film DIF1 in plan view. A plurality of the isolation insulating films DIF2 is arranged along a fourth direction ($\eta$ axis direction in FIG. 25). A plurality of the recesses REC is separated from each other in plan view by a plurality of the isolation insulating films DIF1 and a plurality of the isolation insulating films DIF2.

Described specifically, as shown in FIGS. 26 and 27, a wiring layer IL includes a wiring WR. The wiring WR is located on the surface of the interlayer insulating film ILD5. The wiring WR is a wiring different from the bit line BL and it configures, for example, a circuit of the DRAM region DR. The wiring WR extends in a third direction ($\xi$ axis direction in FIG. 25) in plan view. The wirings WR are arranged at regular interval along the fourth direction ($\eta$ axis direction in FIG. 25). Two wirings WR adjacent to each other have therebetween a row of the contacts CCON1 and CCON2 arranged along the third direction ($\xi$ axis direction in FIG. 25).

As shown in FIGS. 26 and 27, the isolation insulating film DIF2 covers the wiring WR. The isolation insulating film DIF2 therefore has a planar shape following the planar shape of the wiring WR. The isolation insulating film DIF2 is made of a material different from that of the interlayer insulating films ILD1, ILD2, ILD3, ILD4, and ILD5 (for example, silicon nitride film (SiN), silicon oxynitride film (SiON), or silicon carbonitride film (SiCN)). In other words, the isolation insulating film DIF2, similar to the isolation insulating film DIF1, functions as a hard mask for the interlayer insulating films ILD3, ILD4, and ILD5. The isolation insulating film DIF2 is covered with the capacitor insulating film CI, the upper electrode UE, and the conductive film PL. The conductive film PL is covered with the interlayer insulating film ILD6.

Figure 28:
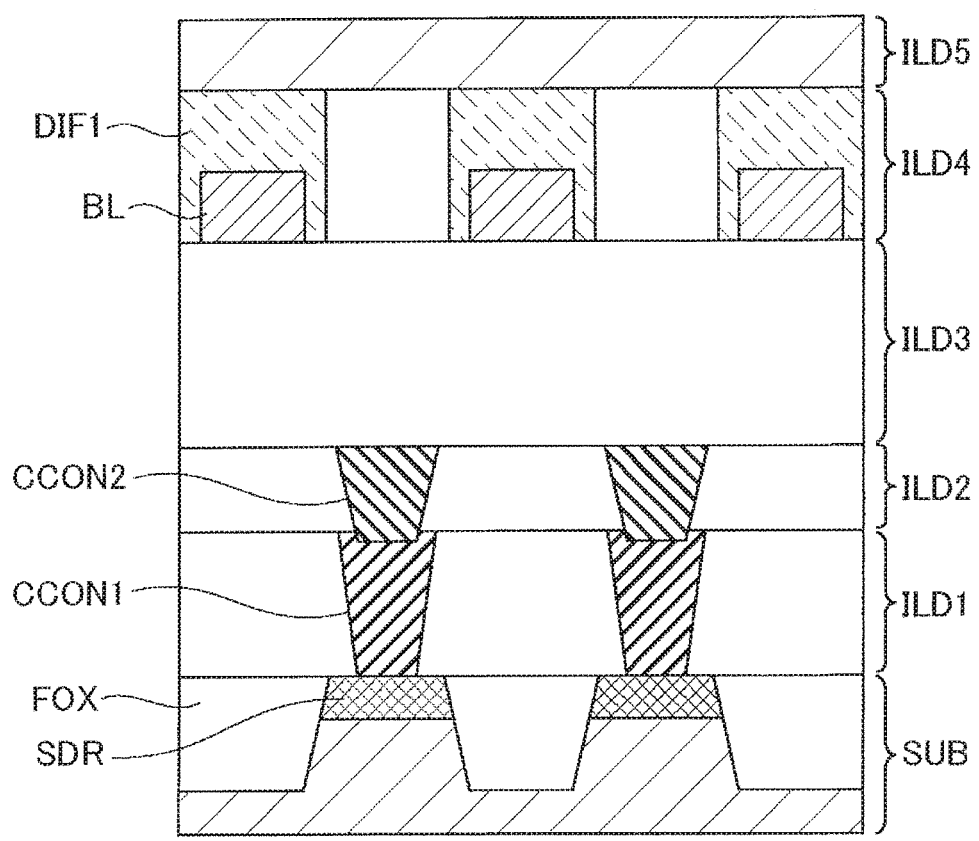
FIG. 28 is a view for describing a method of manufacturing the semiconductor device shown in FIGS. 25 to 27.
Figure 29:
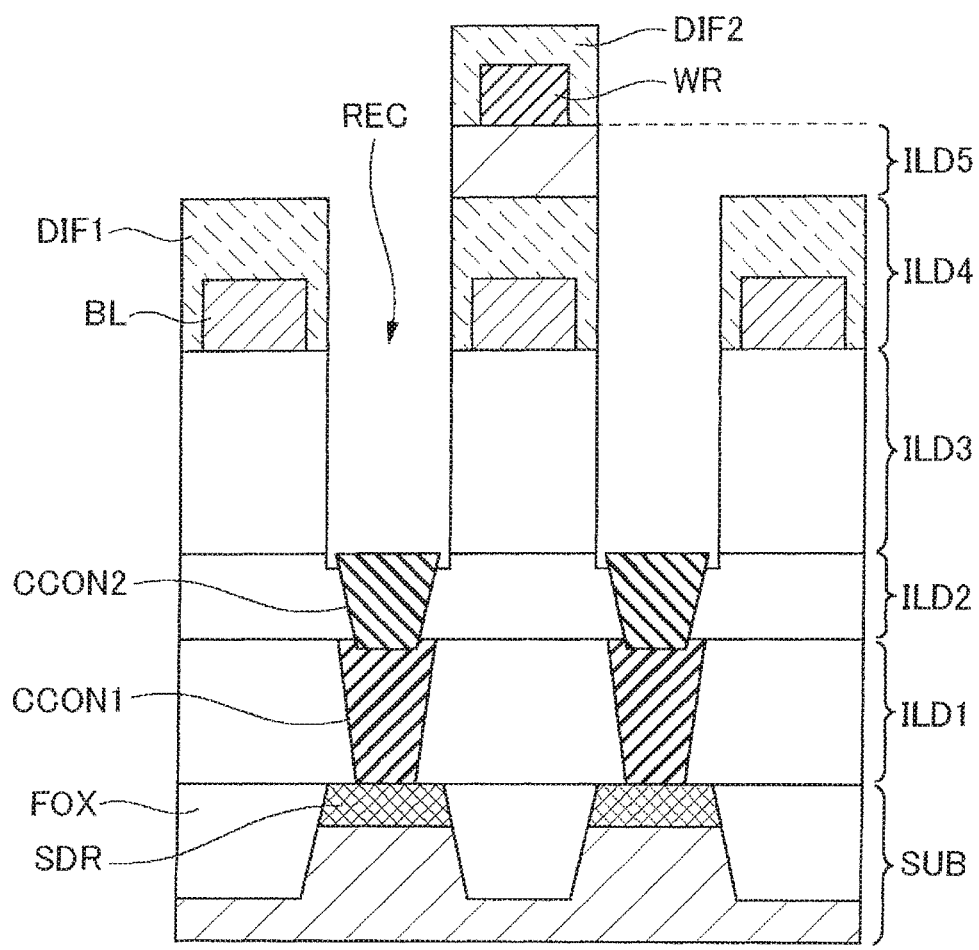
FIG. 29 is a view for describing a method of manufacturing the semiconductor device shown in FIGS. 25 to 27.

FIGS. 28 and 29 are views for describing a method of manufacturing the semiconductor device SD shown in FIGS. 25 to 27. They each correspond to the B-B' cross-sectional view of FIG. 25. A method of manufacturing the semiconductor device SD of the present modification example will next be described.

First, as in the embodiment, a bit line BL and an isolation insulating film DIF1 are formed in an interlayer insulating film ILD4. Steps until the formation of the bit line BL and the isolation insulating film DIF1 are similar to those of the embodiment. Next, as shown in FIG. 28, an interlayer insulating film ILD5 is formed on the interlayer insulating film ILD4. Next, a wiring WR and an isolation insulating film DIF2 are formed on the interlayer insulating film ILD5. A method of forming the wiring WR and the isolation insulating film DIF2 is similar to that of forming the bit line BL and the isolation insulating film DIF1.

Next, as shown in FIG. 29, the interlayer insulating films ILD3, ILD4, and ILD5 are dry etched. In this step, without forming a resist film on the surface of the interlayer insulating film ILD5, the interlayer insulating films ILD3, ILD4, and ILD5 are dry etched directly. In this case, the isolation insulating films DIF1 and DIF2 function as hard masks for the interlayer insulating films ILD3, ILD4, and ILD5. As a result, a region of the interlayer insulating film ILD5 not overlapping with the isolation insulating film DIF2 in plan view is removed. In this case, the interlayer insulating film ILD5 remains only below the isolation insulating film DIF2. A region of the interlayer insulating films ILD3 and ILD4 not overlapping with the isolation insulating films DIF1 and DIF2 in plan view is removed. As a result, a plurality of recesses REC is formed in the interlayer insulating films ILD3 and ILD4.

Next, similar to the embodiment, a lower electrode LE, a capacitor insulating film CI, and an upper electrode UE are formed to configure a capacitor CP. In this case, the lower electrode LE is located only inside the recess REC. The capacitor insulating film CI and the upper electrode UE, on the other hand, extend across the recesses REC adjacent to each other. In this case, the isolation insulating film DIF2 is covered by the capacitor insulating film CI and the upper electrode UE. Next, a conductive film PL is formed in a manner similar to that of the embodiment. In such a manner, the semiconductor device SD of the present modification example is manufactured.

According to the present modification example, a plurality of recesses REC can be formed by subjecting the entire surface of the interlayer insulating film ILD5 to dry etching while the isolation insulating films DIF1 and DIF2 are being formed. In other words, lithography (formation of a resist film) for dividing the recesses REC becomes unnecessary.

The invention made by the present inventors has been described specifically based on the embodiment. It is needless to say that the invention is not limited to the embodiment, but various changes can be made without departing from the scope of the invention.

What is claimed is:

1. A method for manufacturing a semiconductor device comprising:
   forming a first interlayer insulating film over a semiconductor substrate;
   forming a conductive film on the first interlayer insulating film;
   forming a first isolation insulating film on the conductive film;
   selectively removing the conductive film and the first isolation insulating film to expose a part of the first interlayer insulating film and to form a first wiring covered with the first isolation insulating film and a second wiring covered with the first isolation insulating film;
   forming a second interlayer insulating film on the first interlayer insulating film and the first isolation insulating film;
   etching the first and the second interlayer insulating films by using the first isolation insulating film as a mask to form a trench between the first and the second wirings; and
   forming a lower electrode, a capacitor insulating film and an upper electrode in the trench to form a capacitor.

2. The method of manufacturing the semiconductor device according to claim 1, wherein a material of the first isolation insulating film is different from that of the first and the second interlayer insulating films.

3. The method of manufacturing the semiconductor device according to claim 1, wherein an etch selectivity of the first and the second interlayer insulating films is large relative to the first isolation insulating film.

4. The method of manufacturing the semiconductor device according to claim 1, wherein the first and the second wirings comprises a first and a second bit line, respectively.

* * * * *